United States Patent
Takada et al.

(10) Patent No.: US 9,680,419 B2
(45) Date of Patent: Jun. 13, 2017

(54) POWER CONTROLLABLE WIRELESS COMMUNICATION DEVICE

(71) Applicant: Hitachi, Ltd., Chiyoda-ku, Tokyo (JP)

(72) Inventors: Yusuke Takada, Tokyo (JP); Mitsugu Kusunoki, Tokyo (JP); Takao Okazaki, Tokyo (JP); Takashi Matsumoto, Tokyo (JP); Kenta Mochiduki, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 15/185,685

(22) Filed: Jun. 17, 2016

(65) Prior Publication Data

US 2017/0019070 A1 Jan. 19, 2017

(30) Foreign Application Priority Data

Jul. 17, 2015 (JP) ................................. 2015-143286

(51) Int. Cl.
*H03G 3/20* (2006.01)
*H03F 1/02* (2006.01)
(Continued)

(52) U.S. Cl.
CPC .............. *H03F 1/0233* (2013.01); *G01S 7/03* (2013.01); *H03F 3/19* (2013.01); *H03G 3/3042* (2013.01);
(Continued)

(58) Field of Classification Search
CPC ....................................................... H03G 3/20
(Continued)

(56) References Cited

U.S. PATENT DOCUMENTS

| 9,310,203 B2* | 4/2016 | Takase ................... G01C 19/56 |
| 2009/0102702 A1 | 4/2009 | Oka et al. |
| 2010/0171659 A1* | 7/2010 | Waters ................... H04B 17/24 |
| | | 342/357.74 |

FOREIGN PATENT DOCUMENTS

| JP | 4087803 B2 | 5/2008 |
| JP | 4429347 B2 | 3/2010 |

(Continued)

OTHER PUBLICATIONS

Extended European Search Report issued in counterpart European Application No. 16176828.8 dated Dec. 2, 2016 (ten (10) pages).

*Primary Examiner* — Henry Choe
(74) *Attorney, Agent, or Firm* — Crowell & Moring LLP

(57) ABSTRACT

A power controllable wireless communication device includes a variable gain amplifier having a gain that can be controlled based on a gain control signal, a reference power generation circuit, which generates first reference power and second reference power differing from the first reference power, a sensor circuit supplied with selectively power of a high frequency signal output from the variable gain amplifier, and the first reference power and the second reference power generated by the reference power generation circuit, and a control circuit which generates the gain control signal based on a sensor output from the sensor circuit. When controlling power, the control circuit generates the gain control signal based on ratios among a first sensor output corresponding to the first reference power, a second sensor output corresponding to the second reference power, and a high frequency sensor output corresponding to the power of the high frequency signal.

10 Claims, 10 Drawing Sheets

(51) Int. Cl.
  *H03G 3/30* (2006.01)
  *H04W 52/52* (2009.01)
  *H04B 17/13* (2015.01)
  *G01S 7/03* (2006.01)
  *H03F 3/19* (2006.01)
  *H03F 1/30* (2006.01)
  *H04B 17/00* (2015.01)

(52) U.S. Cl.
  CPC ............ *H04B 17/13* (2015.01); *H04W 52/52* (2013.01); *H03F 1/304* (2013.01); *H03F 2200/393* (2013.01); *H03F 2200/451* (2013.01); *H03F 2200/465* (2013.01); *H04B 17/0085* (2013.01)

(58) Field of Classification Search
  USPC .................................................. 330/140, 278
  See application file for complete search history.

(56) References Cited

FOREIGN PATENT DOCUMENTS

| KR | 10 2007 0052923 A | 5/2007 |
| WO | WO 2004/040795 A2 | 5/2004 |

\* cited by examiner

POWER CONTROLLABLE WIRELESS COMMUNICATION DEVICE

BACKGROUND OF THE INVENTION

1. Field of the Invention

The present invention relates to a power controllable wireless communication device. In particular, the present invention relates to a wireless communication device for millimeter wave radar.

2. Description of the Related Art

Since the wireless communication device for millimeter wave radar is expensive at the present time, the wireless communication device for millimeter wave radar is applied to only some luxury cars. Development of an inexpensive wireless communication device for millimeter wave radar (MMIC: Monolithic Microwave Integrated Circuit) is demanded to popularize the millimeter wave radar up to the popular car.

On the other hand, in radio laws in countries, the range of allowable output electric power of millimeter wave radar is stipulated. Among the ranges of the allowable output electric power, minimum output electric power is stipulated by a radio law in Japan. That is, according to the radio raw in Japan, it is demanded to cause the minimum output electric power to fall in a width of 4.77 dB from maximum output electric power.

An electric power adjustment technique is used in the device for millimeter wave radar to satisfy the stipulation of the output electric power range in the radio law. However, the electric power adjustment technique becomes a cause of rising cost. If price lowering of the electric power adjustment technique can be implemented, it becomes possible to provide an inexpensive device for millimeter wave radar.

Techniques concerning the electric power adjustment of the millimeter wave radar are described in, for example, JP-4429347-B2 and JP-4087803-B2.

SUMMARY OF THE INVENTION

As for the wireless communication device, it is demanded to adjust output electric power thereof sometimes for the reason of the radio law or characteristics of the wireless communication device. For example, it is demanded to adjust the wireless communication device to cause output electric power (referred to as power as well below) of the wireless communication device to fall in a range of allowable output electric power as described above.

On the other hand, power of the wireless communication devices varies. The variation is brought about mainly by causes of two kinds described below. First, a first cause is manufacture variations at the time when manufacturing high frequency components included in the wireless communication device, for example, the MMIC, a module substrate mounting the MMIC and a microprocessor for controlling the MMIC, an antenna, and the like. A second cause is brought about by environmental changes, such as changes of power supply voltage fed to the wireless communication device and ambient temperature changes, in transmission operations. Here, the first cause can be regarded as being brought by initial variations, which occur in initial stages of manufacture of the wireless communication device. On the other hand, the second cause can be regarded as being brought by environmental variations.

It is possible to cope with the variations brought about by the first cause by providing the wireless communication device with a circuit block to adjust output electric power. That is, before shipping the wireless communication device, output electric power of the wireless communication device is measured and adjustment is conducted on the circuit block for output electric power adjustment to obtain predetermined output electric power. As a result, it is possible to suppress variations of output electric power caused by the initial variations. Such a technique is described in, for example, JP-4429347-B2. According to the technique described in JP-4429347-B2, it is difficult to suppress the variations of output electric power brought about by the environmental variations.

On the other hand, as for a countermeasure against variations brought about by the second cause, for example, there is a technique as described in JP-4087803-B2. That is, a current monitor circuit and a temperature monitor circuit are provided, and output electric power is adjusted depending upon environmental changes. As a result, it becomes possible to suppress variations of output electric power brought about by the environmental variations.

However, a process of creating a table for the environmental changes and writing the table into a microprocessor is needed to cope with the environmental changes. Furthermore, it is needed to collect data of temperature dependence and the like before shipping to create the table. Therefore, man-hours before shipping increase and an expense required to manufacture the wireless communication device increases.

An object of the present invention is to provide an inexpensive power controllable wireless communication device that can be adjusted in output electric power to cope with environmental changes.

The above-described and other objects and novel features will be made clear by description of the present specification and accompanying drawings.

Among aspects of the invention disclosed in the present application, an outline of representative aspects will now be described briefly.

In an embodiment, the power controllable wireless communication device includes a variable gain amplifier that can be controlled in gain based on a gain control signal, a reference power generation circuit, a sensor circuit, and a control circuit that generates the gain control signal. The reference power generation circuit generates first reference power and second reference power, which is different from the first reference power. The sensor circuit is supplied selectively with power of a high frequency signal output from the variable gain amplifier, the first reference power, and the second reference power. The control circuit generates the gain control signal based on a sensor output from the sensor circuit. When controlling power, the control circuit generates the gain control signal based on ratios among a first sensor output corresponding to the first reference power, a second sensor output corresponding to the second reference power, and a high frequency sensor output corresponding to the power of the high frequency signal, which are supplied from the sensor circuit.

In an embodiment, a power controllable wireless communication device includes a microprocessor and a semiconductor device power controlled by the microprocessor. Here, the semiconductor device includes: a variable gain amplifier configured to amplify a transmission signal and be changeable in gain by a gain control signal; a power amplifier configured to amplify a high frequency signal from the variable gain amplifier and transfer the amplified high frequency signal to an antenna; a power sensor configured to detect power of the high frequency signal transferred from the power amplifier to the antenna; and an interface circuit coupled to the power sensor, the variable gain amplifier, and the microprocessor. Moreover, the power sensor includes: a reference power generation circuit configured to generate first reference power and second reference power different from the first reference power; and a selection circuit configured to select the first reference power, the second reference power, and the power of the high frequency signal from the power amplifier depending upon control from the microprocessor via the interface circuit.

The above-described microprocessor receives a first sensor output, which is output from the power sensor when the first reference power is selected by the selection circuit, a second sensor output, which is output from the power sensor when the second reference power is selected by the selection circuit, and a third sensor output, which is output from the power sensor when the power of the high frequency signal is selected by the selection circuit, via the interface circuit. The microprocessor forms a gain control signal and supplies the gain control signal to the variable gain amplifier via the interface circuit, when controlling power of the wireless communication device based on ratios among the first sensor output, the second sensor output, and the third sensor output.

The first reference power and the second reference power are reference power that is less in changes as compared with the environmental changes. When controlling power, based on ratios among the first sensor output corresponding to the first reference power, the second sensor output corresponding to the second reference power, and the power of the high frequency signal at the time of desired power, the gain control signal is generated. The ratios become constants against the environmental changes. When controlling power, therefore, it becomes possible to adjust the power to the desired power even if environmental changes occur. Furthermore, since it is not demanded to create a table corresponding to the environmental changes, it becomes possible to provide an inexpensive power controllable wireless communication device.

Among aspects of the invention disclosed in the present application, effects obtained by representative aspects will now be described briefly.

It becomes possible to provide an inexpensive power controllable wireless communication device which is less likely to be influenced by the environmental changes.

DESCRIPTION OF THE EMBODIMENTS

Figure 1:
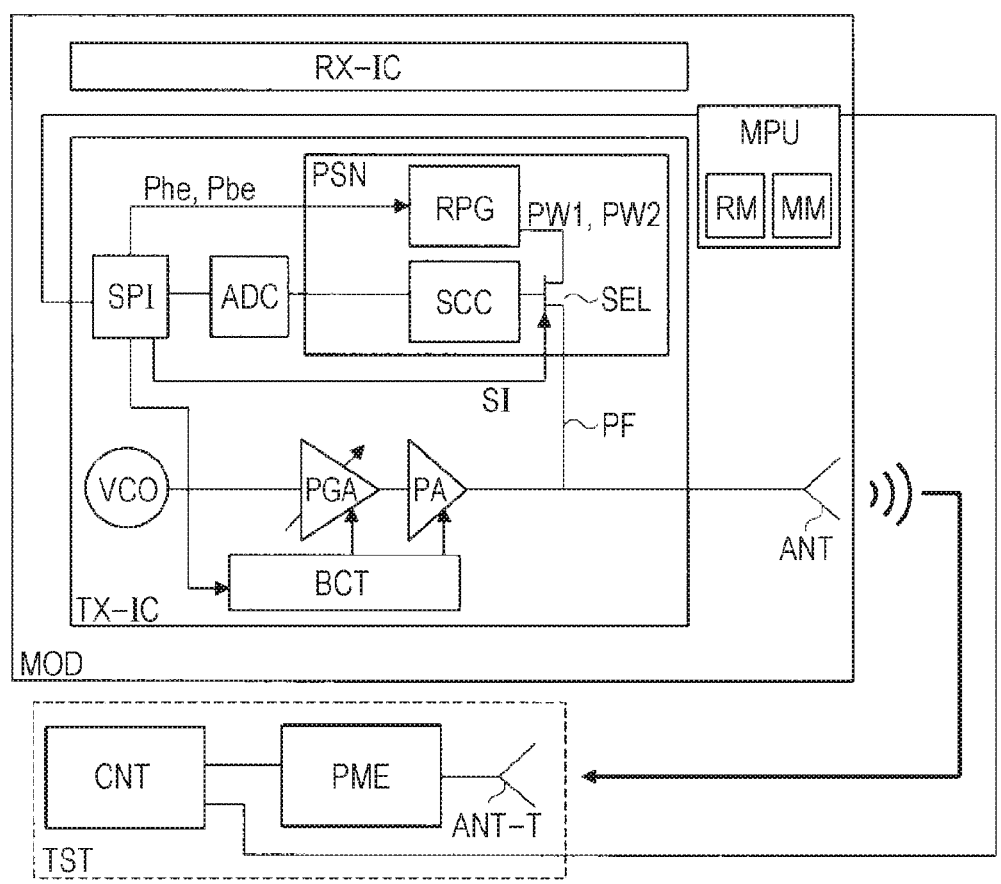
FIG. 1 is a block diagram illustrating a configuration of a wireless communication device according to a first embodiment.

Embodiments of the present invention will be described in detail below with reference to the drawings. Throughout all drawings, the same portions are denoted by like reference numerals in principle and repeated description thereof will be omitted in principle. In the description below, a wireless communication device used in millimeter wave radar will be taken up as an example of the wireless communication device.

First Embodiment

Figure 13:
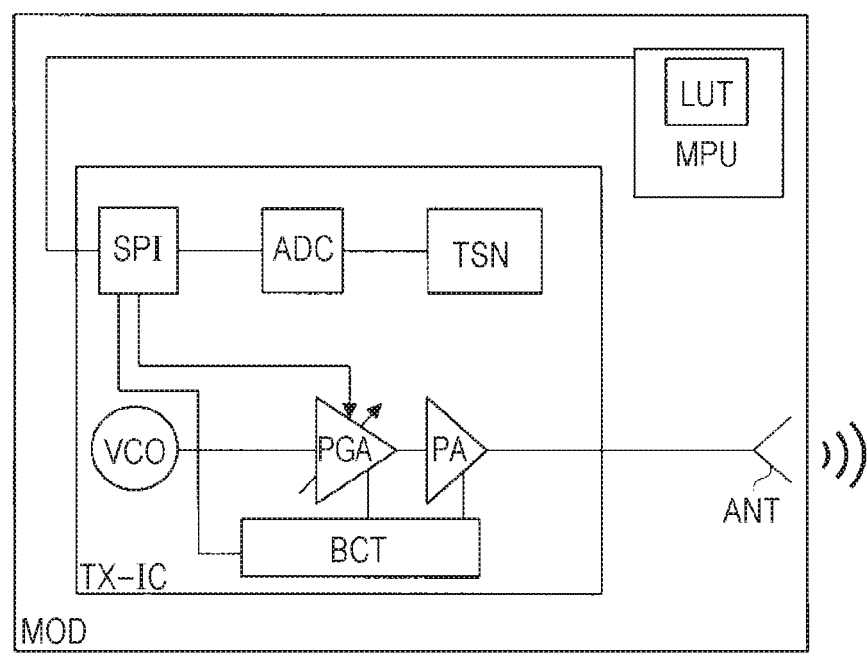
FIG. 13 is a block diagram illustrating a configuration of a wireless communication device studied by the present inventors.

Before describing embodiments, a configuration of a wireless communication device studied by the present inventors prior to the present invention will be described to make features of embodiments clearer.
Studied Wireless Communication Device FIG. 13 is a block diagram illustrating a configuration of the studied wireless communication device. In FIG. 13, MOD denotes a module incorporated in the wireless communication device. The module MOD includes an MMIC, a microprocessor, and so on. The MMIC and the microprocessor are mounted on a module substrate to form the module MOD. In the present specification, the module MOD is regarded as a wireless communication device.

In FIG. 13, a transmission semiconductor device, which constitutes a wireless transmission circuit as the MMIC, is drawn as TX-IC. Furthermore, in FIG. 13, the microprocessor is drawn as MPU. In FIG. 13, ANT denotes an antenna. The antenna ANT is drawn to be included in the module MOD in FIG. 13. However, the antenna ANT may be provided outside the module MOD. Furthermore, although omitted in FIG. 13, the module MOD also includes a reception semiconductor device RX-IC, which constitutes a wireless reception circuit. The reception semiconductor device (referred to as reception semiconductor as well below) RX-IC is mounted on the module substrate in the same way as the transmission semiconductor device (referred to as transmission semiconductor as well below) TX-IC.

The transmission semiconductor TX-IC is supplied with a transmission signal transmitted from a processing device, which is not illustrated in FIG. 13. The transmission semiconductor TX-IC converts the transmission signal to a high frequency signal, and transfers the high frequency signal to the antenna ANT. As a result, the high frequency signal depending upon the transmission signal is output from the antenna ANT. A high frequency signal received by the antenna ANT is supplied to the reception semiconductor RX-IC, frequency-converted to a low frequency signal by the reception semiconductor RX-IC, for example, decoded, and supplied to the processing device, which is not illustrated, as a reception signal. As a result, the reception signal depending upon the high frequency signal received by the antenna ANT is supplied to the processing device from the reception semiconductor RX-IC.

The microprocessor (referred to simply as processor as well below) MPU is coupled to the transmission semiconductor TX-IC and the reception semiconductor RX-IC, and controls the transmission semiconductor TX-IC and the reception semiconductor RX-IC. The processor MPU controls various operations of the transmission semiconductor TX-IC and the reception semiconductor RX-IC. However, only a portion in which the processor MPU controls output electric power (power) of the transmission semiconductor TX-IC is drawn in FIG. 13.

The transmission semiconductor TX-IC includes a voltage controlled oscillation circuit VCO, a bias circuit BCT, a variable gain amplifier PGA, and a power amplifier PA. In addition, the transmission semiconductor TX-IC includes a serial interface circuit SPI (Serial Peripheral Interface: referred to as interface circuit SPI as well below), an analog/digital conversion circuit (referred to as A/D conversion circuit as well below) ADC, and a temperature sensor TSN.

An example in which the transmission semiconductor TX-IC conducts phase modulation on the transmission signal from the processing device, and outputs the phase-modulated high frequency signal from the antenna ANT will now be described.

The transmission signal is supplied to the voltage controlled oscillation circuit VCO as a control voltage. As a result, the voltage controlled oscillation circuit VCO outputs a high frequency signal having a frequency depending upon the voltage of the transmission signal. Since the frequency changes depending upon the voltage of the transmission signal, a phase of the high frequency signal changes depending upon the transmission signal. As a result, phase modulation is conducted. The high frequency signal output from the voltage controlled oscillation circuit VCO is amplified by the variable gain amplifier PGA, further amplified by the power amplifier PA, and transferred to the antenna ANT.

Each of the variable gain amplifier PGA and the power amplifier PA is supplied with a predetermined bias by the bias circuit BCT. The bias circuit BCT is previously set to form a predetermined bias by the processor MPU via the interface circuit SPI. In other words, variations of the output power brought about by initial variations are measured previously, and the processor MPU sets the bias circuit BCT to suppress the variations of the output electric power brought about by initial variations.

The variable gain amplifier PGA is supplied with the gain control signal from the processor MPU via the interface circuit SPI. As a result, the variable gain amplifier PGA amplifies the high frequency signal from the voltage controlled oscillation circuit VCO with a gain depending upon the gain control signal. Adjustment of the output electric power of the transmission semiconductor TX-IC, i.e., control of the power is executed by changing the gain of the variable gain amplifier PGA by means of the gain control signal.

The temperature sensor TSN measures temperature, and supplies an analog signal depending upon the temperature to the A/D conversion circuit ADC. The A/D conversion circuit ADC converts the analog signal depending upon the temperature to digital data, and supplies a conversion result to the interface circuit SPI.

The processor MPU includes a look-up table LUT. For example, before shipping the wireless communication device (module MOD), for example, in an inspection process, correspondence relations between an optimum setting value of the variable gain amplifier PGA depending upon the temperature and the conversion result of the A/D conversion circuit ADC are written into the look-up table LUT.

The wireless communication device (the module MOD) is shipped in the state in which correspondence relations between the optimum value of the variable gain amplifier PGA depending upon the temperature and the conversion result of the A/D conversion circuit ADC are stored in the look-up table LUT.

When measuring a distance by using millimeter wave radar using the wireless communication device illustrated in FIG. 13 (referred to as at the time of distance measuring as well below), the temperature sensor TSN outputs an analog signal depending upon the temperature. The output analog signal is converted by the A/D conversion circuit ADC, and a result of conversion is supplied to the processor MPU via the interface circuit SPI. The processor MPU retrieves a corresponding setting value from a plurality of setting values stored in the look-up table LUT, based on the supplied conversion result. The processor MPU reads out an optimum value corresponding to the conversion result by the retrieval, and supplies the optimum value read out to the variable gain amplifier PGA via the interface circuit SPI as the gain control signal. As a result, it becomes possible to set the gain of the variable gain amplifier PGA depending upon the temperature. In other words, it becomes possible to control the power of the wireless communication device depending upon the temperature and adjust power.

In the wireless communication device illustrated in FIG. 13, the output electric power of the transmission semiconductor TX-IC is not detected, but the wireless communication device illustrated in FIG. 13 detects the temperature and adjusts the output electric power. If a change of the output electric power of the transmission semiconductor TX-IC is brought about by deterioration with age of, for example, the variable gain amplifier PGA or/and the power amplifier PA and so on, therefore, it becomes difficult to adjust the output electric power of the wireless communication device to a desired value. Furthermore, a process provided to find the correspondence relations to be written into the look-up table LUT and a process provided to write the found correspondence relations into the look-up table LUT are needed. As a result, there is a fear that a cost required to manufacture the wireless communication device will increase.

Configuration of Power Controllable Wireless Communication Device

Figure 2:
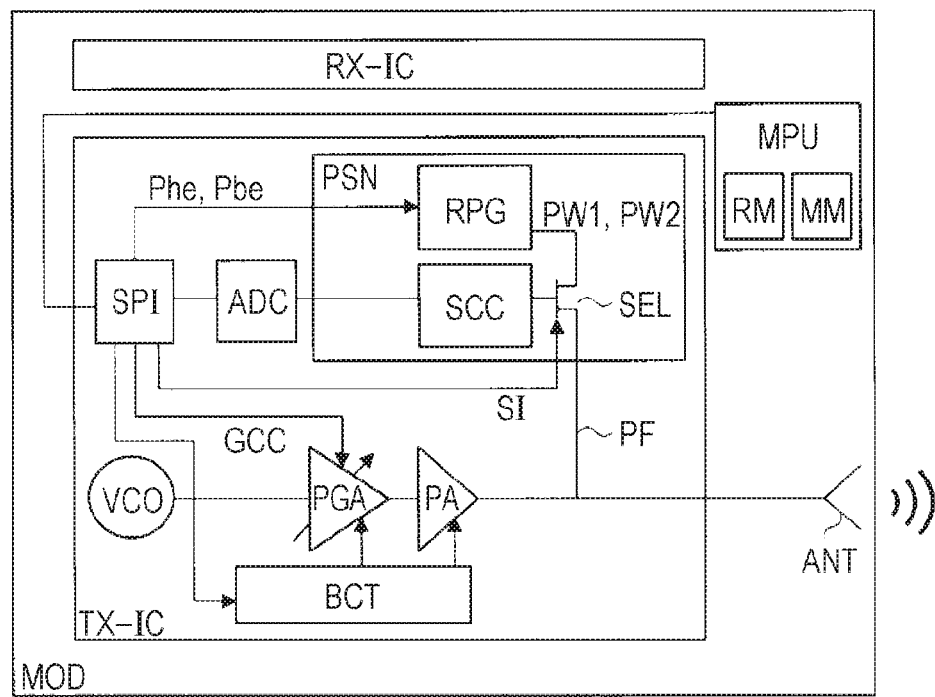
FIG. 2 is a block diagram illustrating the configuration of the wireless communication device according to the first embodiment.

A configuration of a power controllable wireless communication device (MOD) according to the first embodiment will now be described. Each of FIG. 1 and FIG. 2 is a block diagram illustrating the configuration of the power controllable wireless communication device. FIG. 1 illustrates a state before shipping the wireless communication device. FIG. 2 illustrates a state at the time when measuring the distance (at the time of distance measurement). When measuring the distance, the output electric power (power) of the wireless communication device is controlled. Therefore, FIG. 2 is regarded as illustrating the state in which the output electric power is being controlled.

In the wireless communication device (MOD), an operation conducted before shipping differs from an operation at the time of distance measurement. FIG. 1 illustrates an operation state before shipping, and FIG. 2 illustrates an operation state at the time of distance measurement. The configuration of the wireless communication device before shipping is the same as that at the time of distance measurement. Since FIG. 1 and FIG. 2 are drawn to illustrate operations at the respective times, however, there are partially different portions. The configuration of the power controllable wireless communication device according to the first embodiment is similar to the configuration of the wireless communication device illustrated in FIG. 13. Therefore, different portions will be described mainly. If it is necessary for convenience of description, however, the same portions will be also described.

The power controllable wireless communication device (the module MOD in FIG. 1 and FIG. 2) includes a plurality of high frequency components. Among the plurality of high frequency components, only a transmission semiconductor TX-IC, a reception semiconductor RX-IC, and a processor MPU (control circuit) are illustrated in FIG. 1 and FIG. 2. Although a configuration of the reception semiconductor RX-IC is not illustrated in detail, the reception semiconductor RX-IC conducts frequency conversion on a high frequency signal received by the antenna ANT, decodes a low frequency signal obtained by the frequency conversion, and supplies the decoded signal to a processing device, which is not illustrated, as a reception signal.

The transmission semiconductor device TX-IC converts a transmission signal from the processing device to a high frequency signal, transfers the high frequency signal to an antenna ANT, and outputs the high frequency signal from the antenna ANT. A processor MPU controls the transmission semiconductor TX-IC and the reception semiconductor RX-IC.

The processing device, which is not illustrated, finds a distance from an object based on the transmission signal supplied to the transmission semiconductor TX-IC and the reception signal supplied from the reception semiconductor RX-IC.

The transmission semiconductor TX-IC includes a plurality of circuit blocks formed in one semiconductor chip by using a well-known semiconductor manufacture technique. However, only circuit blocks required for description are illustrated in FIG. 1 and FIG. 2. The transmission semiconductor TX-IC includes a voltage controlled oscillation circuit VCO, a variable gain amplifier PGA, a power amplifier PA, a power sensor PSN, an A/D conversion circuit ADC and an interface circuit SPI.

The transmission signal from the processing device is supplied as a control voltage of the voltage controlled oscillation circuit VCO. As a result, the voltage controlled oscillation circuit VCO outputs a high frequency signal having a frequency depending upon the transmission signal. The high frequency signal output from the voltage controlled oscillation circuit VCO is amplified by the variable gain amplifier PGA, and further amplified by the power amplifier PA. The high frequency signal amplified by the power amplifier PA is transferred to the antenna ANT, and transmitted from the antenna ANT as a wireless signal. Control (adjustment) is exercised to cause power of the high frequency signal transmitted from the antenna ANT, i.e., power of the high frequency signal output from the power amplifier PA become a desired value at the time of the distance measurement. In other words, the output electric power of the wireless communication device is controlled at the time of the distance measurement.

By the way, although not especially restricted, since the phase of the high frequency signal changes depending upon the transmission signal, a case where the phase modulation system is adopted in the wireless communication device according to the first embodiment is illustrated in the same way as described with reference to FIG. 13. As a matter of course, the wireless communication device according to the first embodiment is not restricted to the phase modulation system, but various systems such as the amplitude modulation system and the frequency modulation system can be adopted.

The power sensor PSN includes a reference power generation circuit RPG, a sensor circuit SCC, and a selection circuit SEL. The reference power generation circuit RPG receives reference power selection signals Phe and Pbe, and generates a first reference power PW1 or a second reference power PW2, which changes little against environmental changes. The first reference power PW1 and the second reference power PW2 differ from each other in value. The first reference power PW1 or the second reference power PW2 generated by the reference power generation circuit RPG. A portion of the high frequency signal output from the power amplifier PA is distributed and supplied to the selection circuit SEL as power PF of the high frequency signal. The selection circuit SEL selects the reference power (the first reference power PW1 or the second reference power PW2) generated by the reference power generation circuit RPG or the power PF of the high-frequency signal, in dependence upon a power selection signal SI, and supplies the selected power to the sensor circuit SCC. The sensor circuit SCC outputs a sensor output corresponding to the supplied reference power (the first reference power PW1 or the second reference power PW2) or the power PF of the high-frequency signal.

The sensor output, which is output from the power sensor PSN, is supplied to the A/D conversion circuit ADC. The A/D conversion circuit ADC converts the sensor output to digital data, and supplies the digital data obtained by the conversion to the interface circuit SPI. The interface circuit SPI is coupled to the processor MPU, the A/D conversion circuit ADC, the power sensor PSN, a bias circuit BCT, and the variable gain amplifier PGA. The interface circuit SPI is controlled by the processor MPU. In other words, depending upon instructions from the processor MPU, the interface circuit SPI controls signal transfer between the processor MPU and the circuit blocks (A/D conversion circuit ADC, the power sensor PSN, the bias circuit BCT, and the variable gain amplifier PGA) included in the transmission semiconductor TX-IC.

The processor MPU includes a memory circuit RM storing a program, and a memory circuit MM (storage circuit) storing data to be used for power control. The processor MPU conducts various kinds of processing depending upon the program stored in the memory circuit RM. An example of processing conducted as regards the power control will now be described. Depending upon the program, the processor MPU executes control of the interface circuit SPI, forming of the power selection signal SI, forming of the reference power selection signals Pbe and Phe, an arithmetic operation for conducting power control, and so on.

The bias circuit BCT generates biases for the variable gain amplifier PGA and the power amplifier PA, and supplies the biases to the variable gain amplifier PGA and the power amplifier PA, respectively. If setting information is supplied from the interface circuit SPI, the bias circuit BCT sets biases to be supplied to the variable gain amplifier PGA and the power amplifier PA in dependence upon the setting information.

Operation Before Shipping

An operation conducted before shipping the power controllable wireless communication device MOD will now be described with reference to FIG. 1. In more concrete example, an operation conducted in a process for inspection of the wireless communication device MOD will now be described.

An external measuring instrument TST is illustrated in FIG. 1 besides the wireless communication device MOD. The high frequency signal transmitted by the wireless communication device MOD is measured by using the external measuring instrument TST. Although not especially restricted, the external measuring instrument TST includes an antenna ANT-T, a power meter PME, and a control unit CNT. The power meter PME measures power of the high frequency signal received by the antenna ANT-T, and supplies a measurement signal indicating the measured power of the high frequency signal to the control unit CNT. The control unit CNT outputs a measurement result based on the supplied measurement signal to the processor MPU in the wireless communication device MOD. At the time of inspection, it is possible to directly measure the power of the high frequency signal (wireless signal) output from the wireless communication device by using the external measuring instrument TST in this way.

Reduction of Variations Caused by Manufacture Variations

First, in the inspection process, processing for reduction of variations of the output electric power of the wireless communication device caused by the manufacture variations is conducted. For this purpose, the processor MPU instructs the interface circuit SPI to transfer the signal supplied from the processor MPU to the interface circuit SPI to the bias circuit BCT as setting information. Then, the processor MPU supplies a predetermined transmission signal to the voltage controlled oscillation circuit VCO as the control voltage. As a result, the voltage controlled oscillation circuit VCO outputs a high frequency signal having a predetermined frequency from the antenna ANT.

The external measuring instrument TST receives the high frequency signal output from the wireless communication device MOD with the antenna ANT-T. The external measuring instrument TST measures the power of the received high frequency signal with the power meter PME, and supplies a measurement signal to the control unit CNT. The control unit CNT supplies a measurement result based upon the supplied measurement signal to the processor MPU in the wireless communication device MOD. The processor MPU grasps the output electric power of the wireless communication device MOD based on the supplied measurement result, forms a setting signal that brings about desired electric power, which is a target, and supplies the setting signal to the bias circuit BCT via the interface circuit SPI. The bias circuit BCT sets the supplied setting signal, forms biases based upon the setting information, and supplies the biases to the variable gain amplifier PGA and the power amplifier PA, respectively. As a result, gains of the variable gain amplifier PGA and the power amplifier PA are set to cause the output electric power of the wireless communication device MOD to become desired power (target electric power).

Acquisition of Ratios to be Used in Power Adjustment

The variations of the output electric power caused by the manufacture variations are reduced by executing the above-described processing. After attempting to reduce the variations caused by the manufacture variations, the ratios to be used to adjust (control) the power at the time of the environmental changes are acquired. In the embodiment, a case where interior division ratios are used as the ratios will be described. Processing executed to acquire the internal division ratios will be described with reference to FIG. 1 and FIG. 3.

Figure 3:
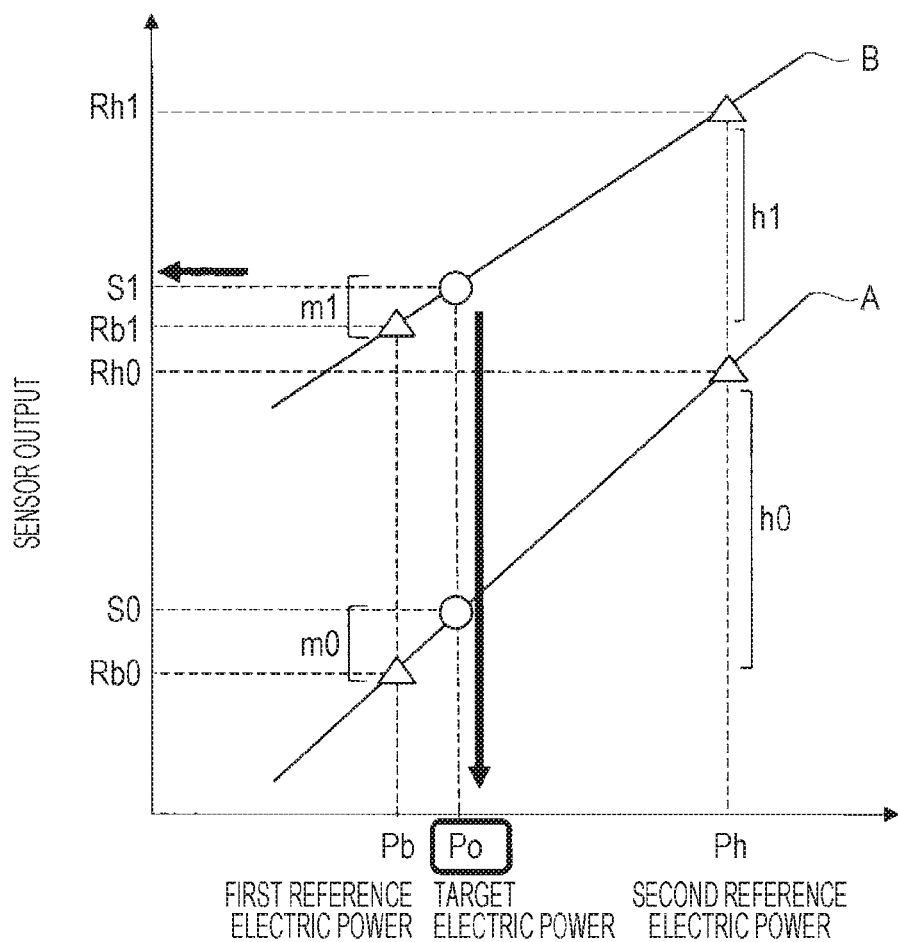
FIG. 3 is a characteristic diagram illustrating a principle of power control according to the first embodiment.

FIG. 3 is a characteristic diagram illustrating a principle of power adjustment executed for the environmental change at the time of the distance measurement, and illustrates characteristics of the power sensor PSN. In FIG. 3, an abscissa axis indicates electric power (power) supplied to the selection circuit SEL, and an ordinate axis indicates the output (the sensor output) from the sensor circuit SCC. The sensor output is, for example, a voltage. In FIG. 3, a straight line A represents characteristics in the state illustrated in FIG. 1, i.e., at the time of inspection, and a straight line B represents characteristics at the time of the distance measurement.

In a state in which the output electric power of the wireless communication device MOD becomes the target electric power, the processor MPU controls the interface circuit SPI to cause the power selection signal formed by the processor MPU to be supplied to the selection circuit SEL. As a result, the power selection signal formed by the processor MPU is supplied to the selection circuit SEL via the interface circuit SPI as the power selection signal SI. At this time, the processor MPU forms a power selection signal that selects the power PF of the high frequency signal for the selection circuit SEL. As a result, a portion of the high frequency signal output from the power amplifier PA is supplied to the sensor circuit SCC via the selection circuit SEL as the power PF of the high frequency signal. At this time, since the high frequency signal output from the power amplifier PA has power corresponding to the target electric power. Therefore, the power PF of the high frequency signal supplied to the sensor circuit SCC also has power corresponding to the target electric power.

The power PF of the high frequency signal at this time is illustrated in FIG. 3 as target electric power Po. When the power PF of the high frequency signal is the target electric power Po, a sensor output S0 (a sensor output corresponding to the power PF of the high frequency signal: a third sensor output) corresponding to the target electric power Po as illustrated in FIG. 3 is output from the sensor circuit SCC.

The sensor output S0 is converted to digital data by the A/D conversion circuit ADC and supplied to the interface circuit SPI. At this time, the processor MPU instructs the interface circuit SPI to output the digital data supplied from the A/D conversion circuit ADC to the interface circuit SPI, to the processor MPU. As a result, the sensor output corresponding to the power PF of the high frequency signal is supplied to the processor MPU. Since the power PF of the high frequency signal at this time corresponds to the target electric power Po, the sensor output is the sensor output S0 corresponding to the target electric power Po. The processor MPU stores the supplied digital data, i.e., digital data corresponding to the sensor output S0 into the memory circuit MM.

Then, the processor MPU instructs the interface circuit SPI to supply the reference power selection signal and the power selection signal formed by the processor MPU to the reference power generation circuit RPG and the selection circuit SEL. At this time, the processor MPU forms, for example, the reference power selection signal Pbe, and forms the power selection signal SI for selection of the reference power (PW1 or PW2) generated by the reference power generation circuit RPG.

Since the reference power generation circuit RPG is supplied with the reference power selection signal Pbe via the interface circuit SPI, the reference power generation circuit RPG generates the first reference power PW1, and supplies the first reference power PW1 to the selection circuit SEL. Since the selection circuit SEL is supplied with the power selection signal SI for selection of the reference power generated by the reference power generation circuit RPG via the interface circuit SPI, the selection circuit SEL selects the supplied first reference power PW1, and supplies the first reference power PW1 to the sensor circuit SCC.

Figure 4:
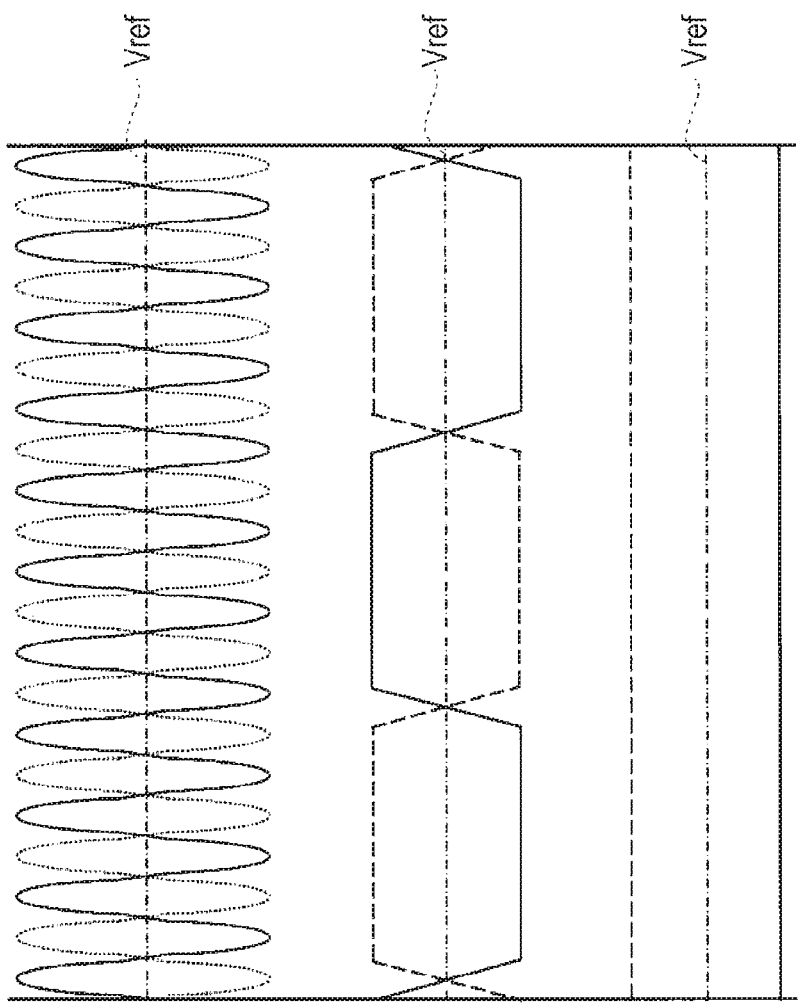
FIGS. 4A to 4C are waveform diagrams for explanation of a reference power generation circuit according to the first embodiment.

The reference power generation circuit RPG will be described in detail below with reference to FIG. 4 and FIG. 7. However, the reference power generation circuit RPG generates the first reference power PW1, which becomes reference, when the reference power selection signal Pbe is supplied, and generates the second reference power PW2, which becomes reference, when the reference power selection signal Phe is supplied. The reference power generation circuit RPG generates the first reference power PW1 and the second reference power PW2, which are small in change (low in dependence) against the environmental changes.

Furthermore, the value of the first reference power PW1 is a value smaller than the target power (target electric power Po), and the second reference power PW2 has a value larger than the target electric power Po. Viewed from another angle, reference power of two stages, i.e., the first reference power PW1 having a small value and the second reference power PW2 having a large value are generated by the reference power generation circuit RPG. If mutual relations among the target electric power Po, the first reference power PW1, and the second reference power PW2 are grasped, the value of the first reference power PW1 and the value of the second reference power PW2 are determined to sandwich the value of the target electric power Po therebetween. By the way, either the first reference power PW1 or the second reference power PW2 may be made equal to the target power (target electric power Po).

In FIG. 3, the value of the first reference power PW1 is represented as the first reference electric power Pb. The first reference electric power Pb is supplied to the sensor circuit SCC via the selection circuit SEL. As a result, a sensor output Rb0 corresponding to the first reference power PW1 (Pb) is output from the sensor circuit SCC. The sensor output Rb0 is converted to digital data by the A/D conversion circuit ADC, and the digital data is supplied to the interface circuit SPI. At this time, the processor MPU instructs the interface circuit SPI to output the digital data supplied from the A/D conversion circuit ADC to the interface circuit SPI, to the processor MPU. As a result, the digital data of the sensor output Rb0 (the first sensor output) corresponding to the first reference power PW1 (Pb) is supplied to the processor MPU. The processor MPU stores the supplied digital data, in other words, the digital data corresponding to the sensor output Rb0 (the first sensor output) into the memory circuit MM.

Then, the processor MPU instructs the interface circuit SPI to supply the reference power selection signal and the power selection signal formed by the processor MPU to the reference power generation circuit RPG and the selection circuit SEL. At this time, the processor MPU forms the reference power selection signal Phe, and forms the power selection signal SI for selection of the reference power (PW1 or PW2) generated by the reference power generation circuit RPG.

Since the reference power generation circuit RPG is supplied with the reference power selection signal Phe via the interface circuit SPI, the reference power generation circuit RPG generates the second reference power PW2, and supplies the second reference power PW2 to the selection circuit SEL. Since the selection circuit SEL is supplied with the power selection signal SI for selection of the reference power generated by the reference power generation circuit RPG via the interface circuit SPI, the selection circuit SEL selects the supplied second reference power PW2, and supplies the second reference power PW2 to the sensor circuit SCC.

In FIG. 3, the value of the second reference power PW2 is represented as the second reference electric power Ph. The second reference electric power Ph is supplied to the sensor circuit SCC via the selection circuit SEL. As a result, a sensor output Rh0 corresponding to the second reference power PW2 (Ph) is output from the sensor circuit SCC. The sensor output Rh0 is converted to digital data by the A/D conversion circuit ADC, and the digital data is supplied to the interface circuit SPI. At this time, the processor MPU instructs the interface circuit SPI to output the digital data supplied from the A/D conversion circuit ADC to the interface circuit SPI, to the processor MPU. As a result, the digital data of the sensor output Rh0 (the second sensor output) corresponding to the second reference power PW2 (Ph) is supplied to the processor MPU. The processor MPU stores the supplied digital data, in other words, the digital data corresponding to the sensor output Rh0 (the second sensor output) into the memory circuit MM.

The processor MPU executes an arithmetic operation to find ratios among the sensor output S0 corresponding to the power PF (Po) of the high frequency signal, the first sensor output Rb0 corresponding to the first reference power PW1 (Pb), and the second sensor output Rh0 corresponding to the second reference power PW2 (Ph), which are stored in the memory circuit MM as described above. In the case of the first embodiment, the processor MPU finds a difference between the sensor output S0 corresponding to the power Po of the high frequency signal and the first sensor output Rb0 corresponding to the first reference power Pb, and a difference between the first sensor output Rb0 corresponding to the first reference power Pb and the second sensor output Rh0 corresponding to the second reference power Ph. In FIG. 3, the difference between the sensor output S0 corresponding to the power Po of the high frequency signal and the first sensor output Rb0 corresponding to the first reference power Pb is illustrated as m0, and the difference between the first sensor output Rb0 corresponding to the first reference power Pb and the second sensor output Rh0 corresponding to the second reference power Ph is illustrated as h0.

The processor MPU finds a ratio between the found difference m0 and difference h0 by arithmetic operation, and stores the ratio into the memory circuit MM as an internal division ratio R0. As a matter of course, since each sensor output is converted to digital data by the A/D conversion circuit ADC, the above-described arithmetic operation is conducted by the digital arithmetic operation. The arithmetic operation conducted at this time is indicated by Expression (1).

[Math. 1]

$$R0 = \frac{S0 - Rb0}{Rh0 - Rb0} = \frac{m0}{h0} \qquad \text{Expression (1)}$$

The same selection circuit SEL and sensor circuit SCC output sensor output respectively corresponding to outputs from the power PF of the high frequency signal, the first reference power PW1 and the second reference power PW2. Since the target electric power Po is sandwiched between the first reference electric power Pb and the second reference electric power Ph, the sensor output S0 corresponding to the target electric power Po exists on a line of a straight line A, which couples the sensor output Rb0 corresponding to the first reference power Pb and the sensor output Rh0 corresponding to the second reference power Ph, as illustrated in FIG. 3. As a result, it becomes possible to find the internal division ratio R0 as the ratio.

When the environment changes, i.e., at the time of the distance measurement, the ratio (the internal division R0) previously stored in the memory circuit MM is used to control the power of the wireless communication device MOD. If the environment in which the wireless communication device MOD is placed changes at the time of the distance measurement, the output electric power output from the transmission semiconductor TX-IC changes. The change of the output electric power is caused by, for example, a change of a gain of the variable gain amplifier PGA or/and the power amplifier PA brought about by, for example, a change of the temperature or the electric power supply voltage. Furthermore, characteristics such as the gain of the power sensor PSN also change due to the environmental change.

When the environment changes, therefore, the sensor output corresponding to the high frequency signal from the power amplifier PA, which is output from the power sensor PSN, changes due to the gain change of the variable gain amplifier PGA or/and the power amplifier PA and the gain change of the power sensor PSN. In a case where the sensor output from the power sensor PSN at this time is compared with a predetermined reference value in, for example, absolute value and the gain of the variable gain amplifier PGA is adjusted, therefore, it becomes difficult to exclude the change of the output electric power caused by the change of the gain of the power sensor PSN brought about by the environmental change. As a result, an electric power error caused by the gain change of the power sensor PSN remains.

In the first embodiment, the first reference power PW1, the second reference power PW2, and the power PF of the high frequency signal are supplied to the same selection circuit SEL and sensor circuit SCC. In the case where characteristics of the selection circuit SEL or/and the sensor circuit SCC change due to the environmental change, therefore, the change of the characteristics is given to sensor outputs respectively corresponding to the first reference power PW1, the second reference power PW2, and the power PF of the high frequency signal. In addition, adjustment of the transmission electric power is conducted based on not absolute values, but ratios (internal division ratio R0) among sensor outputs respectively corresponding to the first reference power PW1, the second reference power PW2, and the power PF of the high frequency signal. The ratio is constant even if characteristics such as gains of the variable gain amplifier PGA, the power amplifier PA and/or the power sensor PSN (the selection circuit SEL and the sensor circuit SCC) change due to the environmental change. Even if the environment changes, therefore, it becomes possible to adjust the transmission electric power output from the wireless communication device MOD to the desired value (the target electric power).

Power Control (Adjustment) at the Time of Distance Measurement

An operation of exercising power control at the time of the distance measurement by using the internal division ratio R0 stored in the memory circuit MM will now be described.

As described above, FIG. 2 illustrates the state of the wireless communication device MOD at the time of the distance measurement. In the state illustrated in FIG. 1, the setting information from the interface circuit SPI is supplied to the bias circuit BCT to suppress variations of the output electric power caused by the manufacture variations. On the other hand, at the time of the distance measurement, a gain control signal GCC from the interface circuit SPI is supplied to the variable gain amplifier PGA. Although not especially restricted, in the first embodiment, the state set in the bias circuit BCT is not changed at the time of the distance measurement. Therefore, the gain of the power amplifier PA is not changed at the time of the distance measurement.

The configuration of the wireless communication device MOD illustrated in FIG. 2 is the same as the configuration illustrated in FIG. 1 except that the setting information from the interface circuit SPI is not supplied to the bias circuit BCT and the gain control signal GCC is supplied to the variable gain amplifier PGA. Furthermore, since the time is when measuring the distance, the processor MPU conducts operation different from the operation at the time of inspection described with reference to FIG. 1, depending upon the program. Operation at the time of distance measurement will now be described with reference to FIG. 2 and FIG. 3.

At predetermined time in a period for which the wireless communication device MOD outputs the high frequency signal, the processor MPU supplies the power selection signal to the interface circuit SPI. At this time, the processor MPU controls the interface circuit SPI to supply the power selection signal supplied by the processor MPU to the selection circuit SEL as the power selection signal SI. At this time, the power selection signal supplied to the interface circuit SPI by the processor MPU is a selection signal that instructs to select the reference power (the first reference power PW1 or the second reference power PW2) and supply the selected reference power to the sensor circuit SCC.

Furthermore, at this time, the processor MPU supplies the reference power selection signal to the interface circuit SPI. At this time, the processor MPU instructs the interface circuit SPI to supply the supplied reference power selection signal to the reference power generation circuit RPG as the reference power selection signal Pbe or Phe. For example, the processor MPU supplies a reference power selection signal corresponding to the reference power selection signal Pbe to the interface circuit SPI. As a result, the reference power selection signal output from the processor MPU is supplied from the interface circuit SPI to the reference power generation circuit RPG as the reference power selection signal Pbe.

Since the reference power selection signal Pbe is supplied, the reference power generation circuit RPG generates the first reference power PW1, and supplies the first reference power PW1 to the selection circuit SEL. The selection circuit SEL supplies the first reference power PW1 to the sensor circuit SCC. As a result, a sensor output corresponding to the first reference power PW1 at a predetermined time is output from the power sensor PSN. The sensor output, which is output from the power sensor PSN, is converted to digital data by the A/D conversion circuit ADC, and the digital data is supplied to the interface circuit SPI.

The processor MPU controls the interface circuit SPI to output the digital data supplied to the interface circuit SPI to the processor MPU with respect to the interface circuit SPI. As a result, the sensor output corresponding to the first reference power PW1 at the predetermined time is supplied to the processor MPU as the digital data. The processor MPU stores the supplied digital data into the memory circuit MM.

Then, the processor MPU supplies the reference power selection signal corresponding to the reference power selection signal Phe to the interface circuit SPI. At this time, the processor MPU instructs the interface circuit SPI to supply the reference power selection signal supplied from the interface circuit SPI to the reference power generation circuit RPG as the reference power selection signal Phe. Since the reference power selection signal Phe is supplied from the interface circuit SPI to the reference power generation circuit RPG, the reference power generation circuit RPG generates the second reference power PW2, and supplies the second reference power PW2 to the selection circuit SEL.

At this time, the selection circuit SEL continues to be in the state in which the reference power is selected. As a result, the second reference power PW2 generated by the reference power generation circuit RPG is supplied to the sensor circuit SCC via the selection circuit SEL. The sensor output corresponding to the second reference power PW2 at the predetermined time is output from the sensor circuit SCC and supplied to the A/D conversion circuit ADC. The sensor output corresponding to the second reference power PW2 is converted to digital data by the A/D conversion circuit ADC, and the digital data is supplied to the interface circuit SPI. At this time, the processor MPU instructs the interface circuit SPI to output the supplied digital data to the processor MPU. As a result, the digital data of the sensor output corresponding to the second reference power PW2 at the predetermined time is supplied from the interface circuit SPI to the processor MPU. The processor MPU stores the digital data into the memory circuit MM.

Each of the first reference power PW1 and the second reference power PW2 generated by the reference power generation circuit RPG changes little against a change of the environment. In FIG. 3, therefore, the value of the first reference power PW1 becomes the first reference electric power Pb, which is the same as that at the time in the inspection process. In the same way, the value of the second reference power PW2 also becomes the second reference electric power Ph, which is the same as that at the time in the inspection process.

In FIG. 3, a case where the value of the sensor output corresponding to each of the first reference power PW1 and the second reference power PW2 becomes higher as compared with the time of the inspection process due to an environment change at the predetermined time when the first reference power PW1 and the second reference power PW2 are supplied to the power sensor PSN is illustrated to facilitate looking at FIG. 3. That is, the value of the sensor output corresponding to the first reference power PW1 (Pb) becomes Rb1, and the value of the sensor output corresponding to the second reference power PW2 (Ph) becomes Rh1.

Desired output electric power, in other words, the sensor output corresponding to the target electric power to be set by the power control exists on a characteristic curve (a straight line B) coupling the sensor output Rb1 corresponding to the first reference power PW1 (Pb) and the sensor output Rh1 corresponding to the second reference power PW2 (Ph). On the line of the straight line B, the value of the sensor output corresponding to the target electric power can be determined at the predetermined time based on the found difference between the sensor output Rb1 and the sensor output Rh1 and the internal division ratio found during the time of the inspection process.

In other words, at the time of the distance measurement, the value S1 of the sensor output, which causes the output electric power to become the target electric power can be found based on a difference h1 between the value Rb1 of the sensor output corresponding to the first reference power PW1 (Pb) at the predetermined time during the time of the distance measurement and the sensor output Rh1 corresponding to the second reference power PW2 (Ph) at the predetermined time during the time of the distance measurement, and the ratio (the internal division ratio R0) previously stored in the memory circuit MM.

The digital data of the value Rb1 of the sensor output corresponding to the first reference power PW1 (Pb) and the digital data of the value Rh1 of the sensor output corresponding to the second reference power PW2 (Ph) at the predetermined time during the time of the distance measurement are stored in the memory circuit MM. Therefore, the processor MPU finds the difference h1 between the value Rh1 of the sensor output and the value Rb1 of the sensor output by an arithmetic operation. The processor MPU finds the value S1 of the sensor output corresponding to the target electric power Po at the predetermined time by multiplying the found difference h1 by the internal division ratio R0 and adding the value Rb1 of the first reference power PW1 to a value m1 obtained by the multiplication. The arithmetic operations executed by the processor MPU are indicated in expressions (2) and (3).

[Math. 2]

$$h1 = Rh1 - Rb1 \qquad \text{Expression (2)}$$

[Math. 3]

$$S1 = R0 \times h1 + Rb1 \qquad \text{Expression (3)}$$

If the processor MPU finds the value S1 of the sensor output corresponding to the target electric power Po at the predetermined time by the arithmetic operations, the processor MPU supplies the power selection signal to the interface circuit SPI. The power selection signal at this time is the selection signal that instructs selection of the power PF of the high frequency signal in the selection circuit SEL. At this time, the processor MPU instructs the interface circuit SPI to supply the power selection signal supplied from the processor MPU to the selection circuit SEL as the power selection signal SI. As a result, the selection circuit SEL supplies the power PF of the high frequency signal to the sensor circuit SCC.

The sensor output corresponding to the power PF of the high frequency signal is output from the sensor circuit SCC to the A/D conversion circuit ADC. The digital data obtained by the conversion in the A/D conversion circuit ADC is supplied to the interface circuit SPI. At this time, the processor MPU instructs the interface circuit SPI to supply the digital data supplied from the A/D conversion circuit ADC to the interface circuit SPI, to the processor MPU. As a result, the digital data obtained by the A/D conversion in the A/D conversion circuit ADC is supplied to the processor MPU.

The processor MPU compares the sensor output represented by the supplied digital data with the sensor output S1 found by the arithmetic operation, forms the gain control signal that makes the value of the sensor output represented by the digital data equal to the sensor output S1, and supplies the gain control signal to the interface circuit SPI. At this time, the processor MPU instructs the interface circuit SPI to supply the supplied gain control signal to the variable gain amplifier PGA as the gain control signal GCC.

The variable gain amplifier PGA changes the gain depending upon the supplied gain control signal GCC. Since the gain of the variable gain amplifier PGA is changed, the output electric power is changed and the power PF of the high frequency signal is changed. The changed power PF of the high frequency signal is supplied to the sensor circuit SCC via the selection circuit SEL again. The sensor output corresponding to the changed power PF of the high frequency signal is output from the sensor circuit SCC. Thereafter, the above-described operation of comparison and operation of gain change are repeated until the sensor output, which is output from the sensor circuit SCC, coincides with the sensor output S1 found by using the arithmetic operation.

At the time of the distance measurement, the above-described operation is repeated, for example, at predetermined time intervals. As a result, it becomes possible to adjust the output electric power from the wireless communication device MOD to the target electric power even if an environment change occurs at the time of the distance measurement.

Reference Power Generation Circuit

The reference power generation circuit RPG is demanded to generate reference power having less dependence upon the environmental change. It is considered for the reference power generation circuit RPG to use the power of the high frequency signal as the reference power in the same way as the high frequency signal output from the wireless communication device MOD. However, the reference power generation circuit that generates the power of the high frequency signal as the reference power becomes complicated in design and manufacture. Therefore, the present inventors have studied to generate the reference power by using a direct current (DC) signal. The studies conducted by the present inventors and verification of the study result will be described.

As illustrated in FIG. 1, the power PF of the high frequency signal output from the wireless communication device MOD, i.e., the portion of the output signal from the power amplifier PA is supplied to the power sensor PSN, and supplied to the sensor circuit SCC via the selection circuit SEL. The selection circuit SEL and the sensor circuit SCC are accompanied by capacitance. Therefore, the selection circuit SEL and the sensor circuit SCC function as a filter circuit. High frequency components are removed by filtering conducted by the filter circuit. As a result, it is considered that the value of the sensor output from the power sensor PSN does not depend upon the frequency of the high frequency signal supplied from the power amplifier PA.

Therefore, the present inventors have considered that even if the signal supplied from the power amplifier PA to the selection circuit SEL is a sine wave of a high frequency as illustrated in FIG. 4A or a rectangular wave of a low frequency as illustrated in FIG. 4B, the value of the sensor output, which is output from the power sensor PSN, is the same if the effective value is equal. In addition, the present inventors have considered that even if the frequency of the signal of the low frequency rectangular wave illustrated in FIG. 4B is lowered and a DC voltage signal as illustrated in FIG. 4C is supplied to the selection circuit SEL, the value of the sensor output, which is output from the power sensor PSN, is the same as the value of the sine wave signal of the high frequency illustrated in FIG. 4A if the effective value is equal.

In each of FIG. 4A to FIG. 4C, the abscissa axis indicates time, and the ordinate axis indicates voltage. In FIG. 4A to FIG. 4C, a dot-dash line indicates a reference voltage Vref. The signal of the high frequency sine wave changes in voltage above and below centering around the reference voltage Vref as indicated by a solid line and a dash line in FIG. 4A. It is demanded to measure a voltage on the upper side (positive electrode side) and a voltage on the lower side (negative electrode side) with respect to the reference voltage Vref to measure the electric power (power). In the same way, the signal of the low frequency rectangular wave also changes in voltage above and below centering around the reference voltage Vref as illustrated by a solid line and a dash line in FIG. 4B. In this case as well, a voltage on the upper side (positive electrode side) and a voltage on the lower side (negative electrode side) with respect to the reference voltage Vref are measured to measure the power. In the same way, as for the DC voltage signal as well, a signal having a voltage on the upper side (positive electrode side) and a signal having a voltage on the lower side (negative electrode side) centering around the reference voltage Vref are considered as illustrated by a solid line and a dash line in FIG. 4C. In other words, the voltage signal on the upper side (positive electrode side) and the voltage signal on the lower side (negative electrode side) with respect to the reference voltage Vref are measured to measure the power.

Figure 5:
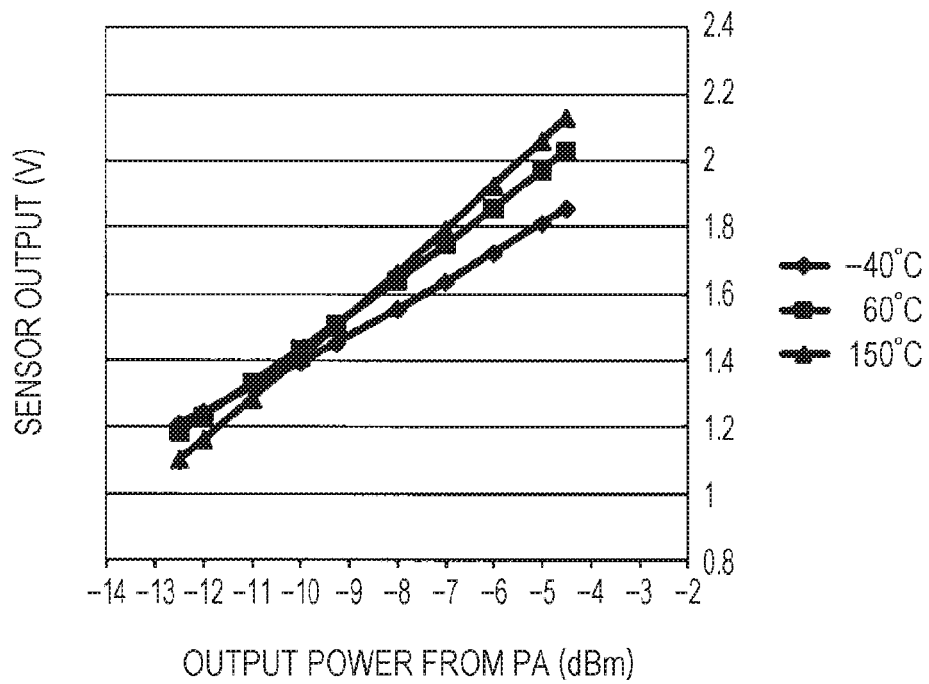
FIG. 5 is a characteristic diagram illustrating characteristics of a power sensor according to the first embodiment.
Figure 6:
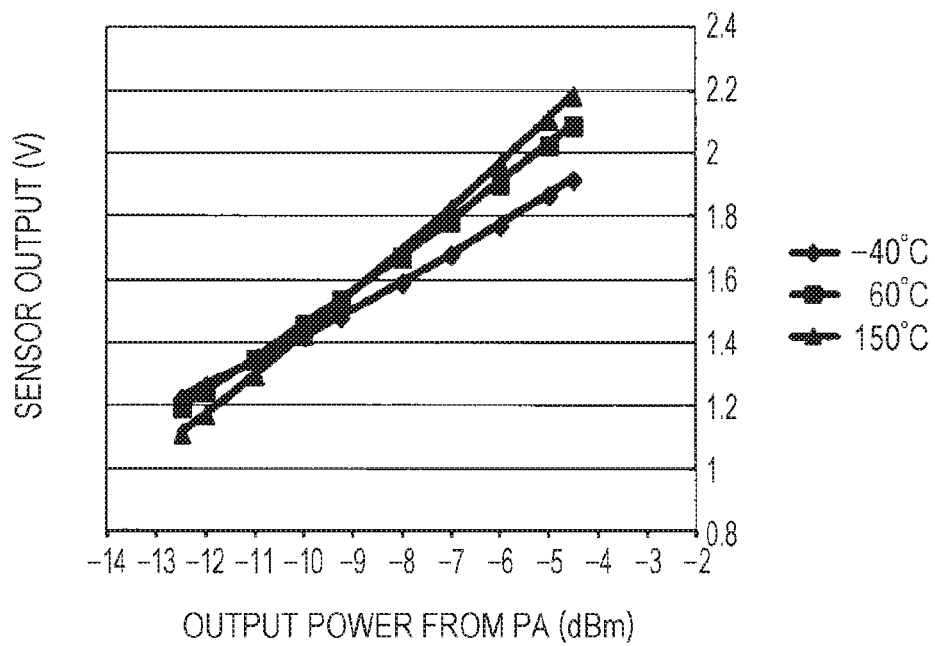
FIG. 6 is a characteristic diagram illustrating characteristics of the power sensor according to the first embodiment.

To verify the above-described thought, the sensor output, which is output from the power sensor PSN, has been found by an arithmetic operation in a case where the signal supplied from the power amplifier PA to the power sensor PSN is set to be a DC voltage signal and in a case where the signal is set to be a high frequency sine wave signal. FIG. 5 is a characteristic diagram illustrating characteristics of the power sensor PSN in the case where the signal supplied from the power amplifier PA to the power sensor PSN is set to be a DC voltage signal. FIG. 6 is a characteristic diagram illustrating characteristics of the power sensor PSN in the case where the signal supplied from the power amplifier PA to the power sensor PSN is set to be a high frequency sine wave signal. In each of FIG. 5 and FIG. 6, the abscissa axis indicates power of a signal output from the power amplifier PA, and the ordinate axis indicates the value of the sensor output, which is output from the power sensor PSN. Furthermore, in FIG. 5 and FIG. 6, a point of a rhomb (♦) indicates a case where the power from the power amplifier PA is changed in a state in which the temperature is −40° C. A point of a square shape (■) indicates a case where the power from the power amplifier PA is changed in a state in which the temperature is 60° C. In the same way, a point of a triangle (▲) indicates a case where the power from the power amplifier PA is changed in a state in which the temperature is 150° C.

Comparing FIG. 5 with FIG. 6, it is appreciated that if the power of the signal output from the power amplifier PA is equal, the value of the sensor output, which is output from the power sensor PSN, also becomes nearly equal. As the present inventors have studied, if the effective value is equal, the value of the sensor output, which is output from the power sensor PSN, becomes nearly equal even if the signal is the high frequency signal or the DC voltage signal.

Therefore, it is possible to use the DC voltage signal as the reference power PW1 and PW2 formed by the reference power generation circuit RPG. In the first embodiment, a voltage that is a DC signal is used in the reference power generation circuit RPG as the first reference power PW1 and the second reference power PW2. On the other hand, as for power of the high frequency signal supplied to the selection circuit SEL, a portion of the high frequency signal output from the power amplifier PA is used.

Furthermore, the DC voltage signal used as the first reference power PW1 and the second reference power PW2 is demanded to have small dependence upon the environmental change. In the first embodiment, a reference voltage (consultation voltage) generated by a bandgap voltage generation circuit (Bandgap Reference) capable of generating a stable voltage against the environmental change such as a temperature change is used as a voltage signal to generate the first reference power PW1 and the second reference power PW2.

By the way, it will be appreciated from FIG. 6 as well that the characteristics of the power sensor PSN change due to the temperature change, which is one of the environmental changes.

Configuration of Power Sensor

Figure 7:
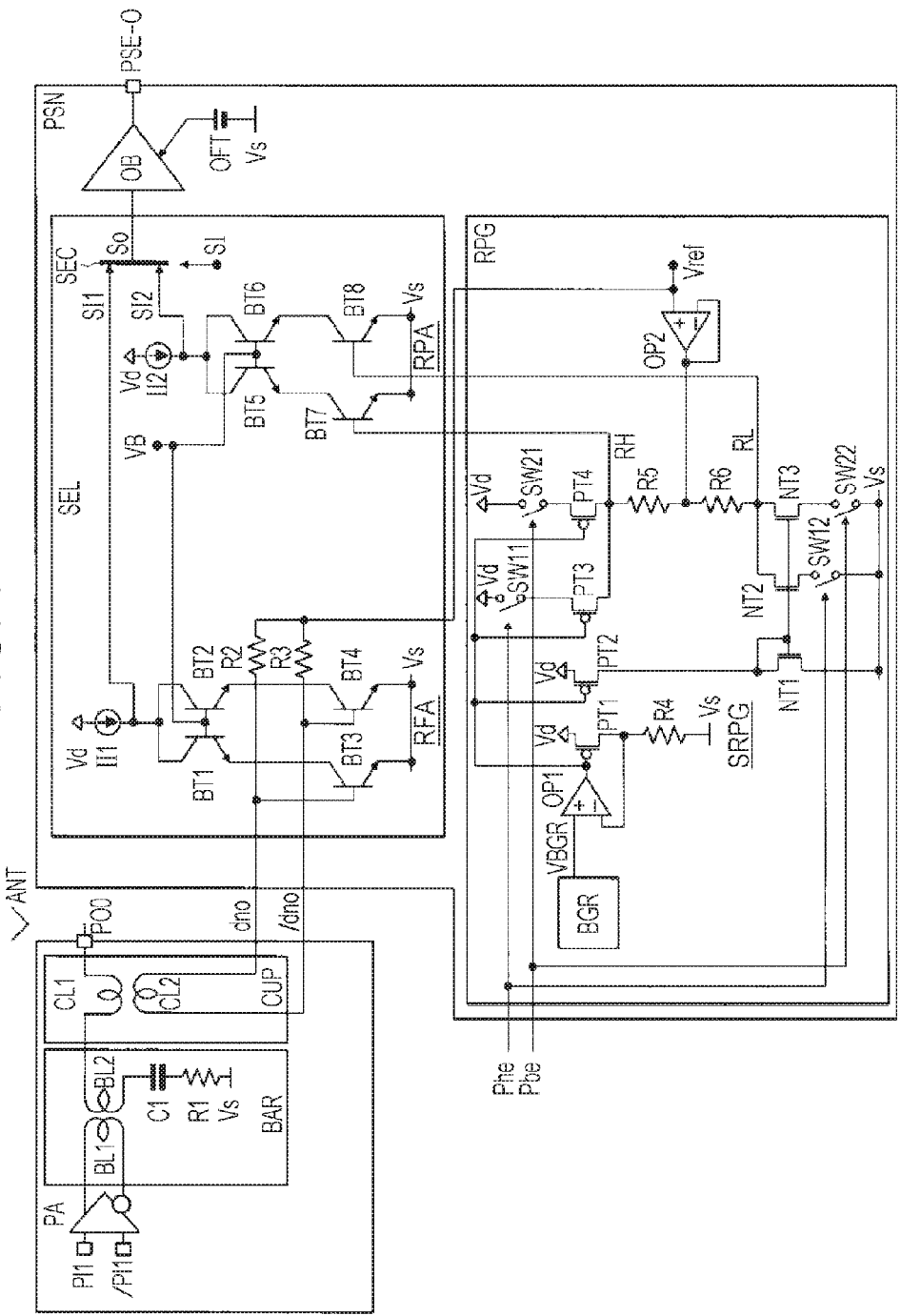
FIG. 7 is a circuit diagram illustrating a configuration of the power sensor according to the first embodiment.

FIG. 7 is a circuit diagram illustrating a configuration of the power sensor PSN according to the first embodiment. A configuration of a transmission system output portion relating to the transmission of the high frequency signal is also illustrated in FIG. 7 for convenience of description.

As the transmission system output portion, a configuration between the power amplifier PA and the antenna ANT illustrated in FIG. 1 is illustrated. In FIG. 1, the output of the power amplifier PA is schematically illustrated to be supplied to the antenna ANT to facilitate the description. In FIG. 7, a more concrete configuration is illustrated. In other words, a balun BAR and a coupler CUP are coupled between the power amplifier PA and the antenna ANT.

In FIG. 1, each of the input and output of the power amplifier PA is represented by one signal line. In FIG. 7, however, the power amplifier PA is illustrated more specifically. That is, the power amplifier PA includes one pair of differential input terminals PI1 and /PI1. The pair of the differential input terminals PI1 and /PI1 is supplied with a differential high frequency signal corresponding to a high frequency signal to be transmitted from the antenna ANT. The power amplifier PA amplifies the differential high frequency signal supplied to the pair of differential input terminals PI1 and /PI1, and supplies the amplified differential high frequency signal to the balun BAR.

The balun BAR includes coils BL1 and BL2 mutual inductance coupled, a capacitance element C1, and a resistance element R1. Both end portions of the coil BL1 are supplied with the differential high frequency signal amplified by the power amplifier PA. One of end portions of the coil BL2 is connected to a ground voltage Vs via the capacitance element C1 and the resistance element R1, and the other of the end portions of the coil BL2 is used as an output terminal of the balun BAR, and connected to the coupler CUP. The balun BAR functions to convert the differential high frequency signal supplied to the both end portions of the coil BL1 to a single phase high frequency signal and supply the single phase high frequency signal to the coupler CUP via the output terminal. Furthermore, the balun BAR functions to conduct impedance conversion and attempt impedance matching between the power amplifier PA and the coupler CUP.

The coupler CUP includes coils CL1 and CL2 mutual inductance coupled. The output terminal of the balun BAR is coupled to the antenna ANT via the coil CL1. As a result, the high frequency signal output from the balun BAR is transferred to the antenna ANT, and output from the antenna ANT. Since the coil CL2 is mutual inductance coupled to the coil CL1, a high frequency signal corresponding to the high frequency signal flowing through the coil CL1 occurs through the coil CL2. In other words, a portion of the high frequency signal to be transmitted from the antenna ANT is taken out into the coil CL2. One of end portions of the coil CL2 is connected to a node dno, and the other of the end portions of the coil is connected to a node /dno. Therefore, a potential at the node dno and a potential at the node /dno change differentially depending upon the transmitted high frequency signal. Furthermore, since the strength of the mutual inductance coupling between the coil CL1 and the coil CL2 changes depending upon the power of the high frequency signal transmitted from the antenna ANT, potentials at the nodes dno and /dno change depending upon the power of the transmitted high frequency signal.

In the first embodiment, the power amplifier PA is incorporated in the transmission semiconductor TX-IC, and the balun BAR, the coupler CUP, and the antenna ANT are provided outside the transmission semiconductor TX-IC. However, the balun BAR, the coupler CUP, and the antenna ANT are not restricted to be provided outside the transmission semiconductor TX-IC. For example, the balun BAR and the coupler CUP may be incorporated in the transmission semiconductor TX-IC. Furthermore, the configuration of the balun BAR and the coupler CUP is not restricted to the above-described configuration, either.

A portion of the high frequency signal taken out by the coupler CUP is supplied to the power sensor PSN as the power PF of the high frequency signal. In other words, the power sensor PSN is connected to the nodes dno and /dno. As illustrated in FIG. 1, the power sensor PSN includes the selection circuit SEL, the reference power generation circuit RPG, and the sensor circuit SCC. First, a configuration of the selection circuit SEL will be described.

In the first embodiment, the selection circuit SEL includes a first current conversion circuit RFA to convert the power of the high frequency signal taken out by the coupler CUP to a current, a second current conversion circuit RPA to convert the reference power (the first reference power and the second reference power) generated by the reference power generation circuit RPG to a current, and a selector SEC.

The first current conversion circuit RFA includes NPN-type bipolar transistors (referred to as B transistors as well below) BT1 to BT4, a constant current source II1, and resistance elements R2 and R3. The resistance elements R2 and R3 are connected between the nodes dno and /dno and a predetermined reference voltage Vref, respectively. The B transistors BT1 and BT2 are paired, and respective collectors are connected in common. The collectors connected in common are connected to a power supply voltage Vd via the constant current source II1. Bases of the paired B transistors BT1 and BT2 are also connected in common. The bases connected in common are connected to a predetermined bias voltage VB. The B transistors BT3 and BT4 are also paired. Emitters of the B transistors BT3 and BT4 are connected to the ground voltage Vs. A collector of the B transistor BT3 is connected to an emitter of the B transistor BT1. A collector of the B transistor BT4 is connected to an emitter of the B transistor BT2. A base of the paired B transistor BT3 is connected to the node dno, and a base of the B transistor BT4 is connected to the node /dno.

The nodes dno and /dno are biased to the reference voltage Vref via the resistance elements R2 and R3. Therefore, potentials at the nodes dno and /dno change to the upper side (positive electrode side) or the lower side (negative electrode side) centering around the reference voltage Vref depending upon the high frequency signal. In other words, voltages at the node dno and /dno change centering around the reference voltage Vref as illustrated in FIG. 4A.

The voltage changes at the nodes dno and /dno are transferred to the bases of the B transistors BT3 and BT4. Therefore, collector currents of the B transistors BT3 and BT4 change depending upon the changes of the voltages at the node dno and /dno. The changes of the collector currents of the B transistors BT3 and BT4 are combined (added) via the B transistors BT1 and BT2 biased at the bases by the predetermined bias voltage VB. A difference current between the combined current change and a constant current generated by the constant current source I1 is supplied to an input terminal SI1 of the selector SEC as an output of the first current conversion circuit RFA.

The second current conversion circuit RPA includes B transistors BT5 to BT8, and a constant current source I2. In the second current conversion circuit RPA, the B transistors BT5 to BT8 conduct an operation similar to that of the B transistors BT1 to BT4 in the first current conversion circuit RFA, and the constant current source I2 conducts an operation similar to that of the constant current source I1. In other words, bases of the paired B transistors BT5 and BT6 are connected in common, and the bases connected in common are supplied with the predetermined bias voltage VB. Collectors of the B transistors BT5 and BT6 are also connected in common, and the collectors connected in common are connected to the electric power supply voltage Vd via the constant current source I2. Emitters of the paired B transistors BT7 and BT8 are connected to the ground voltage Vs, a collector of the B transistor BT7 is connected to an emitter of the B transistor BT5, and a collector of the B transistor BT8 is connected to an emitter of the B transistor BT6.

Bases of the B transistors BT7 and BT8 are supplied with the reference power (first reference power PW1 and the second reference power PW2). In the first embodiment, a voltage signal on the positive electrode side and a voltage signal on the negative electrode side centering around the reference voltage Vref is used as the reference power. In an example illustrated in FIG. 7, the base of the B transistor BT7 is supplied with the voltage signal on the positive electrode side and the base of the B transistor BT8 is supplied with the voltage signal on the negative electrode side. The B transistors BT7 and BT8 let collector currents flow depending upon the voltage signal on the positive electrode side and the voltage signal on the negative electrode side supplied to the bases, respectively. The collector currents flowing through the B transistors BT7 and BT8 are combined (added) via the B transistors BT5 and BT6. A difference current between a constant current formed by the constant current source I2 and the current formed by the combining (addition) is supplied to the input terminal SI2 of the selector SEC as an output of the second current conversion circuit RPA.

The reference power generation circuit RPG includes a band gap voltage generation circuit BGR and a selection generation circuit SRPG. The selection generation circuit SRPG receives the reference power selection signals Phe and Pbe and a reference voltage VGBR generated by the band gap voltage generation circuit BGR, and generates the first reference power PW1 or the second reference power PW2 depending upon the reference power selection signals Phe and Pbe. Respective values (voltage values) of the generated first reference power PW1 and second reference power PW2 are based upon the reference voltage VBGR.

The selection generation circuit SRPG includes amplifiers OP1 and OP2, N-channel type insulation gate transistors (referred to as N-type FETs as well below) NT1 to NT3, P-channel type insulation gate transistors (referred to as P-type FETs as well below) PT1 to PT4, resistance elements R4 to R6, and switches SW11, SW12, SW21 and SW22.

The amplifier OP1 includes a positive phase input terminal (+) and an inverting input terminal (−). The positive phase input terminal (+) is supplied with a reference voltage VBGR generated by the band gap voltage generation circuit BGR. An output signal of the amplifier OP1 is supplied to gates of the P-type FETs PT1 to PT4. A source of the P-type FET PT1 is connected to the electric power supply voltage Vd, and a drain of the P-type FET PT1 is connected to the ground voltage Vs via the resistance element R4. The inverting input terminal (−) of the amplifier OP1 is connected to the drain of the P-type FET PT1. The P-type FET PT1 is controlled by the output signal of the amplifier OP1. In other words, the P-type FET PT1 is controlled by a voltage of the output signal, which is output from the amplifier OP1, to cause a voltage at the resistance element R4 generated by a drain current flowing through the P-type FET PT1 to become equal to the reference voltage VBGR.

A source of the P-type FET PT2 is connected to the electric power supply voltage Vd, and a drain thereof is connected to a drain and a gain of the N-type FET NT1. A source of the N-type FET NT1 is connected to the ground voltage Vs. A gate of the N-type FET NT1 is connected to gates of the N-type FETs NT2 and NT3. A source of the N-type FET NT2 is connected to the ground voltage Vs via the switch SW12 switch controlled by the reference power selection signal Phe. A source of the N-type FET NT3 is connected to the ground voltage Vs via the switch SW22 switch controlled by the reference power selection signal Pbe. Drains of the N-type FETs NT2 and NT3 are connected in common, and connected to an output of the amplifier OP2 via the resistance element R6.

Since the gate of the P-type FET PT2 is supplied with the output signal of the amplifier OP1, a drain current of the P-type FET PT2 becomes a value proportionate to the drain current of the P-type FET PT1. When the switch SW12 is turned on, a current mirror circuit is formed by the N-type FETs NT1 and NT2. In this case, a drain current of the N-type FET NT2 becomes a value proportionate to the drain current of the P-type FET PT1. In the same way, when the switch SW22 is turned on, a current mirror circuit is formed by the N type FETs NT1 and NT3. In this case, a drain current of the N-type FET NT3 becomes a value proportionate to the drain current of the P-type FET PT1. In the first embodiment, sizes of the N-type FETs NT2 and NT3 are set to cause the value of the drain current that flows when the switch SW12 is turned on by the reference power selection signal Phe to become larger than the value of the drain current that flows when the switch SW22 is turned on by the reference power selection signal Pbe.

A voltage signal RL is output from the drains of the N-type FETs NT2 and NT3 connected in common, and supplied to the base of the B transistor BT8.

An inverting input terminal (−) of the amplifier OP2 is connected to an output of the amplifier OP2, and a positive phase input terminal (+) thereof is supplied with a predetermined reference voltage Vref. Since the inverting input terminal (−) is connected to the output, the amplifier OP2 operates as a voltage follower circuit. Therefore, the resistance element R6 is supplied with the reference voltage Vref from the voltage follower circuit. When the switch SW12 or the switch SW22 is turned on, a current (drain current) flows from the reference voltage Vref toward the ground voltage Vs. Since the current flows, a voltage drop occurs across the resistance element R6, and the voltage of the voltage signal RL becomes a voltage on the lower side (on the negative electrode side) with respect to the reference voltage Vref.

A current (drain current) that flows when the switch SW12 is turned on by the reference power selection signal Phe is greater than a current that flows when the switch SW22 is turned on by the reference power selection signal Pbe. Therefore, an absolute value of the voltage signal RL at the time when the switch SW12 is turned on by the reference power selection signal Phe becomes larger than an absolute value of the voltage signal RL at the time when the switch SW22 is turned on by the reference power selection signal Pbe.

A source of the P-type FET PT3 is connected to the electric power supply voltage Vd via the switch SW11 switch controlled by the reference power selection signal Phe. A source of the P-type FET PT4 is connected to the electric power supply voltage Vd via the switch SW21 switch controlled by the reference power selection signal Pbe. Drains of the P-type FETs PT3 and PT4 are connected in common, and are connected to the output of the amplifier OP2 via the resistance element R5. A voltage signal RH is output from the drains of the P-type FET PT3 and the P-type FET PT4 connected in common, and is supplied to a base of the B transistor BT7.

When the switch SW11 is turned on by the reference power selection signal Phe, a gate of the P-type FET PT3 is supplied with the output signal of the amplifier OP1. Therefore, a drain current that flows through the P-type FET PT3 becomes a value proportionate to the drain current that flows through the P-type FET PT1. In the same way, when the switch SW21 is turned on by the reference power selection signal Pbe, a gate of the P-type FET PT4 is supplied with the output signal of the amplifier OP1. Therefore, the drain current that flows through the P-type FET PT4 becomes a value proportionate to the drain current that flows through the P-type FET PT1. In the first embodiment, sizes of the P-type FETs PT3 and PT4 are set to cause the value of the drain current that flows when the switch SW11 is turned on to become larger than the value of the drain current that flows when the switch SW21 is turned on.

When the switch SW11 or SW21 is turned on, a current flows from the electric power supply voltage Vd toward the reference voltage Vref, which is the output of the voltage follower circuit (OP2). Therefore, the voltage of the voltage signal RH becomes a value on the upper side (on the positive electrode side) with respect to the reference voltage Vref. The value of the drain current that flows when the switch SW11 is turned on is greater than the value of the drain current that flows when the switch SW21 is turned on. Therefore, an absolute value of the voltage signal RH at the time when the switch SW11 is turned on by the reference power selection signal Phe becomes greater than an absolute value of the voltage signal RH at the time when the switch SW21 is turned on.

When the reference power is selected by the reference power selection signal Phe, therefore, the switch SW11 and the switch SW12 are turned on, and the reference power generation circuit RPG outputs the voltage signal RH (a second voltage of positive polarity) and the voltage signal RL (a second voltage of the negative polarity), which have large voltage in absolute value. When the reference power is selected by the reference power selection signal Pbe, the switch SW21 and the switch SW22 are turned on, and the reference power generation circuit RPG outputs the voltage signal RH (a first voltage signal of positive polarity) and the voltage signal RL (a first voltage of negative polarity), which have a small voltage in absolute value. Although not especially restricted, the values of the voltage signal RH (the first voltage of positive polarity) and the voltage signal RL (the first voltage of negative polarity), which have a small voltage in absolute value, have equal values in absolute value. The values of voltage signal RH (the second voltage of positive polarity) and the voltage signal RL (the second voltage of negative polarity), which have a large voltage in absolute value, have equal values in absolute value.

Since the values of the voltage signals RH and RL are based upon the reference voltage VBGR generated by the band gap voltage generation circuit BGR, voltage values that have less dependence upon changes of environment such as temperature and that change less are obtained.

The band gap voltage generation circuit BGR generates a voltage having less dependence upon environmental changes, and various circuits are known. Here, therefore, detailed description will be omitted.

The first current conversion circuit RFA receives a portion of the high frequency signal output from the antenna ANT as power PF of the high frequency signal. In the first current conversion circuit RFA, a current corresponding to a signal on the positive electrode side with respect to the reference voltage Vref, and a current corresponding to a signal on the negative electrode side with respect to the reference voltage Vref, included in the received high frequency signal are added up, and a resultant current is supplied to the input terminal SI1 of the selector SEC.

On the other hand, the second current conversion circuit RPA receives the voltage signals RH and RL as reference power (the first reference power PW1 and the second reference power PW2). In the second current conversion circuit RPA, a current corresponding to the voltage signal RH on the positive electrode side with respect to the reference voltage Vref and a current corresponding to the voltage signal RL on the negative electrode side with respect to the reference voltage Vref are added up, and a resultant current is supplied to the input terminal SI2 of the selector SEC. In the reference power generation circuit RPG, the absolute values of the voltage signals RH and RL are changed depending upon the reference power selection signals Phe and Pbe. As a result, it becomes possible to change the value of an added current supplied to the input terminal SI2 of the selector SEC by the reference power selection signals Phe and Pbe.

The selector SEC converts currents supplied to the respective input terminals SI1 and SI2 to voltages. The selector SEC selects the voltage corresponding to the current supplied to the input terminal SI1 or the voltage corresponding to the current supplied to the input terminal SI2 in dependence upon the power selection signal SI, and outputs the selected voltage from an output terminal So.

The output signal output from the output terminal So of the selector SEC is supplied to an output amplifier OB. Although not especially restricted, the output amplifier OB is an amplifier having an offset OFT. The output amplifier OB amplifies the output signal from the selector SEC, and outputs the amplified signal from an output terminal PSE-O to the A/D conversion circuit ADC in a subsequent stage as the sensor output. In the first embodiment, adjustment of the voltage level of the sensor output is conducted in the output amplifier OB to conform to an input range of the A/D conversion circuit ADC in the subsequent stage.

In the example illustrated in FIG. 7, the output amplifier OB is equivalent to the sensor circuit SCC illustrated in FIG.

1. However, the sensor circuit SCC is not restricted to the output amplifier OB, but various circuits can be used as the sensor circuit SCC.

An operation at the time of the inspection process and an operation at the time of the distance measurement will now be described with reference to FIG. 7.

At the time of the inspection process, the high frequency signal from the coupler CUP at the time when the target electric power Po is output is supplied to the nodes dno and /dno. The high frequency signal on the positive electrode side and the high frequency signal on the negative electrode side respectively at the nodes dno and /dno are supplied to the first current conversion circuit RFA as the power PF of the high frequency signal. In the first current conversion circuit RFA, amplitudes of the high frequency signal on the positive electrode side and the high frequency signal on the negative electrode side are converted respectively to currents by the B transistors BT3 and BT4, and the currents are added up. A difference between the current obtained by addition and the constant current of the constant current source II1 is supplied to the input terminal SI1 of the selector SEC. At this time, the selector SEC selects the voltage corresponding to the current supplied to the input terminal SI1 depending upon the power selection signal SI, and outputs the voltage from the output terminal So. The output signal output from the output terminal So is supplied to the output amplifier OB, and output from the output amplifier OB as the sensor output S0. The sensor output S0 is converted to digital data, and the digital data is stored in the memory circuit MM.

Then, the power selection signal SI brings the selector SEC into a state in which the selector SEC selects the current supplied to the input terminal SI2 as the voltage. At this time, the switches SW21 and SW22 are turned on by, for example, the reference power selection signal Pbe. Since the switches SW21 and SW22 are turned on, the selection generation circuit SRPG generates the voltage signal RH having a voltage that is located on the positive electrode side with respect to the reference voltage Vref and that is small in absolute value, and the voltage signal RL having a voltage that is located on the negative electrode side with respect to the reference voltage Vref and that is small in absolute value. The selection generation circuit SRPG supplies the voltage signals RH and RL to the second current conversion circuit RPA as the first reference power PW1. In the second current conversion circuit RPA, the voltage signals RH and RL are converted to currents by the B transistors BT7 and BT8, and addition is conducted. A difference between the current obtained by the addition and the constant current of the constant current source II2 is supplied to the input terminal SI2 of the selector SEC.

The selector SEC converts the current supplied to the input terminal SI2 to the voltage, and supplies the voltage to the output amplifier OB. The output amplifier OB outputs the sensor output (Rb0) corresponding to the supplied output signal of the selector SEC. The sensor output (Rb0) is converted to digital data, and the digital data is stored in the memory circuit MM.

Then, the switches SW11 and SW12 are turned on by the reference power selection signal Phe. Since the switches SW11 and SW12 are turned on, the selection generation circuit SRPG generates the voltage signal RH having a voltage that is located on the positive electrode side with respect to the reference voltage Vref and that is large in absolute value, and the voltage signal RL having a voltage that is located on the negative electrode side with respect to the reference voltage Vref and that is large in absolute value.

The selection generation circuit SRPG supplies the voltage signals RH and RL to the second current conversion circuit RPA as the second reference power PW2. In the second current conversion circuit RPA, the voltage signals RH and RL are converted to currents by the B transistors BT7 and BT8, and addition is conducted. A difference between the current obtained by the addition and the constant current of the constant current source II2 is supplied to the input terminal SI2 of the selector SEC.

The selector SEC converts the current supplied to the input terminal SI2 to the voltage, and supplies the voltage to the output amplifier OB. The output amplifier OB outputs the sensor output (Rh0) corresponding to the supplied output signal of the selector SEC. The sensor output (Rh0) is converted to digital data, and the digital data is stored in the memory circuit MM.

The processor MPU calculates the internal division ratio R0 based on the digital data corresponding to the sensor outputs (S0, Rb0, and Rh0) stored in the memory circuit MM, and stores the internal division ratio R0 into the memory circuit MM.

The operation in the case where the power is controlled at the time of distance measurement will now be described.

The power selection signal SI brings the selector SEC into a state in which the selector SEC selects the current supplied to the input terminal SI2 as the voltage. At this time, the electrode switches SW21 and SW22 are turned on by, for example, the reference power selection signal Pbe. As a result, the selection generation circuit SRPG generates the voltage signal RH having a voltage that is located on the positive electrode side with respect to the reference voltage Vref and that is small in absolute value, and the voltage signal RL having a voltage that is located on the negative electrode side and that is small in absolute value. The selection generation circuit SRPG supplies the voltage signals RH and RL to the second current conversion circuit RPA as the first reference power PW1. In the second current conversion circuit RPA, the voltage signals RH and RL are converted to currents and addition is conducted. A difference between the current obtained by the addition and the constant current of the constant current source II2 is supplied to the input terminal SI2 of the selector SEC.

The selector SEC converts the current supplied to the input terminal SI2 thereof to a voltage, and supplies the voltage to the output amplifier OB. The output amplifier OB outputs the sensor output (Rb1) corresponding to the supplied output signal of the selector SEC. The sensor output (Rb1) is converted to digital data, and the digital data is stored in the memory circuit MM.

Then, the switches SW11 and SW12 are turned on by the reference power selection signal Phe. As a result, the selection generation circuit SRPG generates the voltage signal RH having a voltage that is located on the positive electrode side with respect to the reference voltage Vref and that is large in absolute value, and the voltage signal RL having a voltage that is located on the negative electrode side with respect to the reference voltage Vref and that is large in absolute value. The selection generation circuit SRPG supplies the voltage signals RH and RL to the second current conversion circuit RPA as the second reference power PW2. In the second current conversion circuit RPA, the voltage signals RH and RL are converted to currents, and addition is conducted. The difference between the current obtained by the addition and the constant current of the constant current source II2 is supplied to the input terminal SI2 of the selector SEC.

The selector SEC converts the current supplied to the input terminal SI2 to the voltage and supplies the voltage to the output amplifier OB. The output amplifier OB outputs the sensor output (Rh1) corresponding to the supplied output signal of the selector SEC. The sensor output (Rh1) is converted to digital data, and the digital data is stored in the memory circuit MM.

The processor MPU executes an arithmetic operation based on the internal division ratio (R0) stored in the memory circuit MM and the sensor output (Rb1 or Rh1), and finds the sensor output (S1) at the time when controlling the power.

Then, the power selection signal SI causes the selector SEC to select the voltage corresponding to the current supplied to the input terminal SI1. At this time, the high frequency signals supplied from the coupler CUP to the power sensor PSN are converted to currents, and added up by the first current conversion circuit RFA. A difference between the current obtained by the addition and the constant current of the constant current source II1 is supplied to the input terminal SI1 of the selector SEC. As a result, at the time of the distance measurement, the voltage corresponding to the power PF of the high frequency signal output from the antenna ANT is output from the output terminal So of the selector SEC. Therefore, a sensor output corresponding to the power of the high frequency signal is output from the output amplifier OB as well. The sensor output is converted to digital data, and the digital data is supplied to the processor MPU. The processor MPU compares the value of the supplied sensor output with the previously found sensor output (S1), and generates the gain control signal GCC to cause coincidence. As a result, the power of the wireless communication device is adjusted to the target electric power.

In the first embodiment, it is not necessary to find a correction value for each of the environmental changes such as the temperature. In addition, a process of previously storing the respectively found correction values into the table is not demanded. Furthermore, a sensor output that becomes a target when controlling the power is calculated by using a ratio between a sensor output corresponding to the reference power of two stages that is less in dependence upon the environmental changes and the sensor output corresponding to the target electric power. The ratio is less in dependence upon the environmental changes. As a result, it becomes possible to provide an inexpensive power controllable wireless communication device capable of adjusting the output electric power to desired electric power.

With reference to FIG. 1 and FIG. 2, an example in which transmission and reception of signals between the processor MPU and circuit blocks within the transmission semiconductor TX-IC are conducted by using the interface circuit SPI has been described. However, the example is not restrictive. For example, terminals corresponding to respective circuit blocks may be provided in the transmission semiconductor TX-IC to conduct signal transmission and reception directly between the processor MPU and the circuit blocks. The processor MPU may be incorporated in the transmission semiconductor TX-IC.

Second Embodiment

Figure 8:
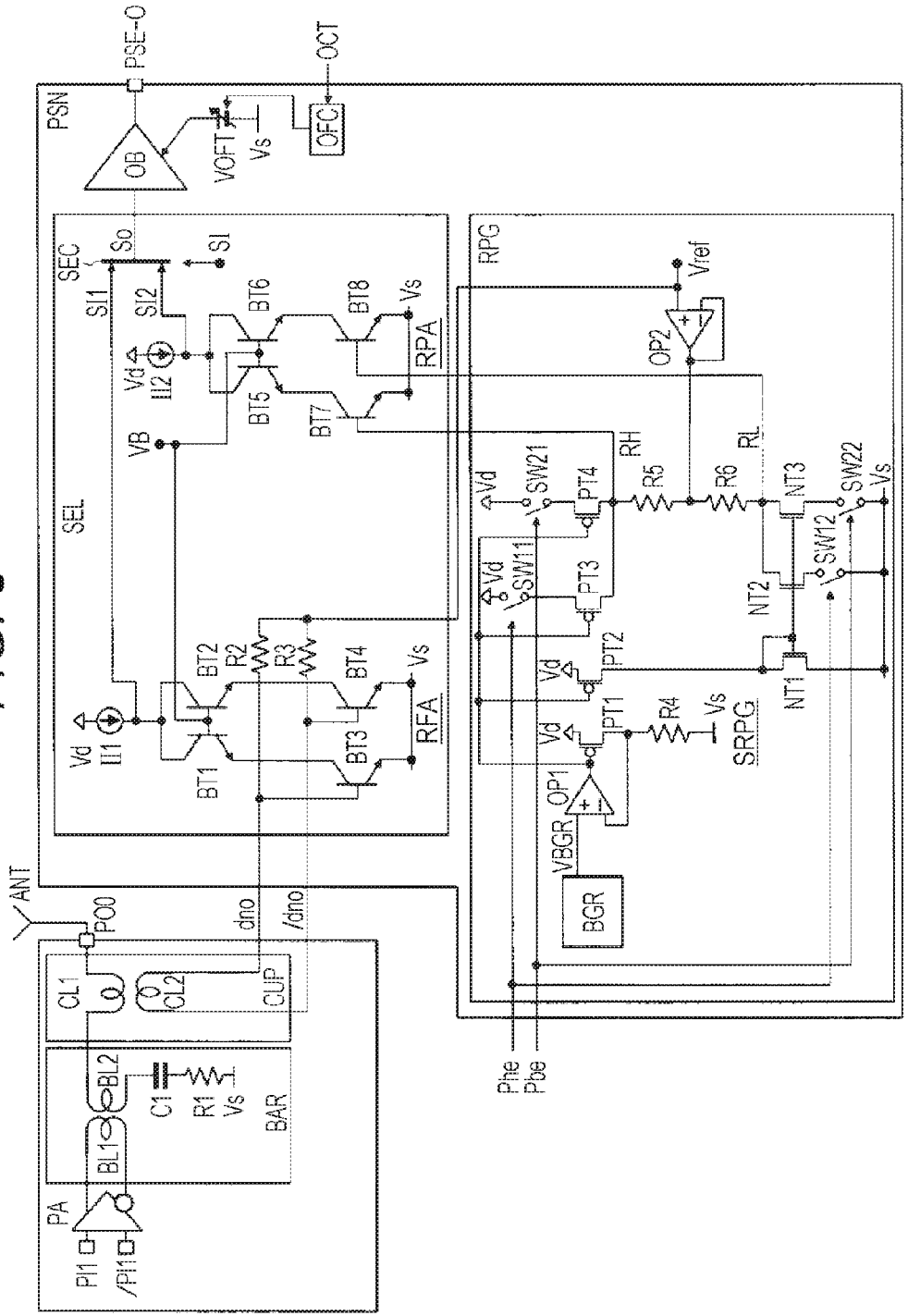
FIG. 8 is a circuit diagram illustrating a configuration of a power sensor according to a second embodiment.

FIG. 8 is a circuit diagram illustrating a configuration of a power sensor according to a second embodiment. In FIG. 8 as well, a transmission system output portion is illustrated besides the power sensor in the same way as FIG. 7. The configuration of the power sensor illustrated in FIG. 8 is similar to the configuration of the power sensor described with reference to FIG. 7. A different portion is only a portion relating to the output amplifier OB. Therefore, the portion relating to the output amplifier OB will be described mainly, and description of other portions will be omitted in principle.

In the second embodiment, a temperature characteristic adjustment circuit is added to the wireless communication device described in the first embodiment. In the first embodiment, the offset OFT of the output amplifier OB is fixed. On the other hand, in the second embodiment, the offset VOFT of the output amplifier OB is made variable. In other words, the output amplifier OB according to the second embodiment is a variable offset amplifier. The variable offset VOFT is set to a desired offset depending upon an offset control signal OCT supplied from the processor MPU by an output level adjustment circuit OFC. Although not especially restricted, in the second embodiment, a value of the variable offset VOFT can be adjusted to eight stages. In other words, a desired offset is specified from offsets of eight stages by the offset control signal OCT from the processor MPU. As a result, the output amplifier has the specified offset. The temperature characteristic adjustment circuit is formed by the variable offset VOFT and the output level adjustment circuit OFC. By the way, the offset control signal OCT is also supplied from the processor MPU via the interface circuit SPI.

In the second embodiment, the processor MPU controls the output level adjustment circuit OFC by using the offset control signal OCT to cause the variable offset VOFT to assume different values depending upon whether the time is time when measuring the power PF of the high frequency signal from the coupler CUP by using the power sensor PSN (referred to as time of transmission output monitor as well below) and time when measuring the reference power by using the power sensor PSN (referred to as time of reference power monitor as well below). The variable offset VOFT assumes different values in this way. Even if the power of the high frequency signal and the reference power are equal in value, therefore, the sensor output, which is output from the power sensor PSN, can be made different values depending upon whether the time is the time of transmission output monitor or the time of reference power monitor. By doing so, it becomes possible to add a constant temperature offset when adjusting the power. For example, it becomes possible to compensate temperature dependence generated in portions in the power sensor PSN or subsequent stages at the time of the power adjustment.

A principle of power adjustment (control) according to the second embodiment will now be described with reference to FIG. 9 and FIG. 10. It is now assumed that the sensor output, which is output from the power sensor PSN, has temperature characteristics depending upon the input power (the power of the high frequency signal and the reference power) supplied to the power sensor PSN. Furthermore, it is assumed that if the input power is equal, the sensor output has the same temperature dependence when the power of the high frequency signal is supplied and when the reference power is supplied.

Figure 9:
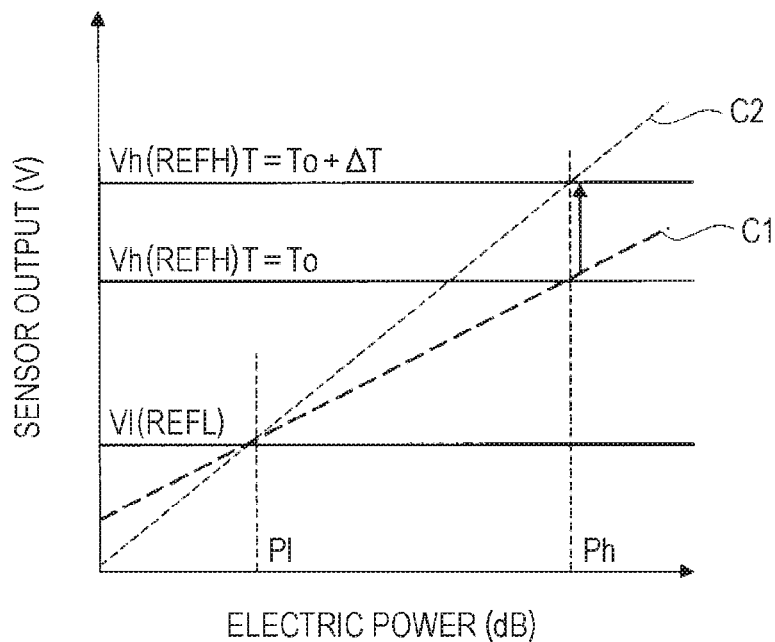
FIG. 9 is a characteristic diagram for explanation of a principle of power control according to the second embodiment.
Figure 10:
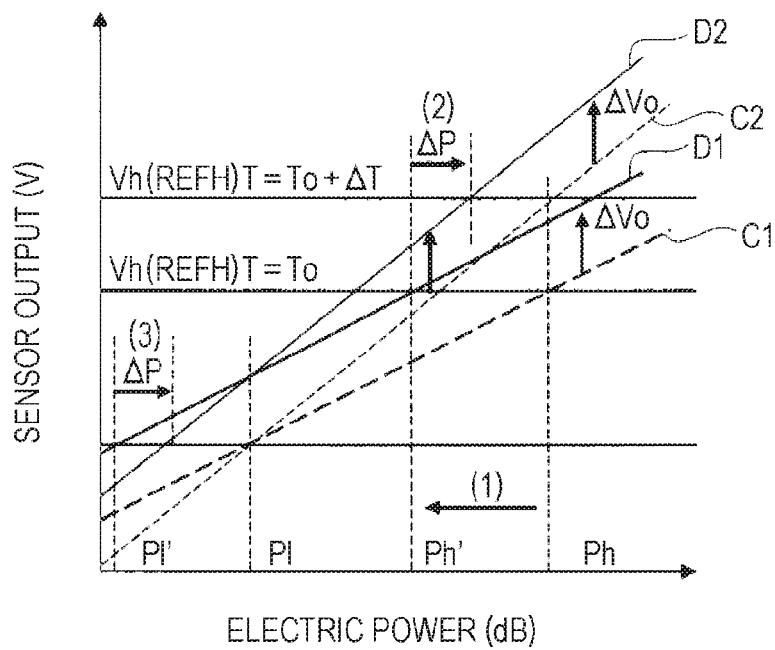
FIG. 10 is a characteristic diagram for explanation of a principle of the power control according to the second embodiment.

In FIG. 9 and FIG. 10, an abscissa axis indicates electric power, and an ordinate axis indicates the sensor output from the power sensor PSN. In FIG. 9 and FIG. 10, REFL indicates the value of the sensor output at the time when the first reference power PW1, which is smaller in value between the reference power of two stages (the first reference power PW1 and the second reference power PW2), is supplied to the power sensor PSN. REFH indicates the value of the sensor output at the time when the second reference power PW2, which is larger in value between the reference power of two stages, is supplied to the power sensor PSN.

FIG. 9 illustrates a case where the processor MPU makes the value of the variable offset VOFT equal at the time of transmission output monitor and at the time of reference power monitor. For facilitating the description, it is now assumed that in FIG. 9 the value of the sensor output from the power sensor PSN becomes Vh when the second reference power PW2 is power Ph, in other words, when the second reference power PW2 having power Ph is supplied to the power sensor PSN at the time of reference power monitor. It is also supposed that the value of the sensor output from the power sensor PSN becomes Vh when the power PF of the high frequency signal having power Ph is supplied to the power sensor PSN at the time of transmission output monitor.

When the second reference power PW2 and the power PF of the high frequency signal having the same power Ph are supplied to the power sensor PSN, the value of the sensor output becomes the same value Vh (REFH) T=To+ΔT even if the temperature T changes from temperature To to temperature To+ΔT (temperature change) because of the same temperature characteristics. In other words, there is only a change from the value of the sensor output Vh (REFH) T=To at the time when the temperature T is the temperature To to the value Vh (REFH) T=To+ΔT. In the case where the target electric power is, for example, Ph, therefore, adjustment to the target electric power Ph is possible even if the temperature changes from the temperature To to the temperature To+ΔT. At the time of power adjustment, therefore, temperature dependence does not occur.

When the first reference power PW1 is power Pl, the temperature dependence does not occur at the time of power adjustment in the same way. Therefore, the temperature dependence does not occur when calculating the internal division ratio using the sensor output Vl (REFL) corresponding to the first reference power PW1 (Pl) and the sensor output Vh (REFH) T=To corresponding to the second reference power PW2 (Ph) and conducting power adjustment by using the internal division ratio.

In FIG. 9, dash lines C1 and C2 are characteristic curves obtained by interpolating between the sensor output at the time when the power PF of the high frequency signal is the power Ph and the sensor output at the time when the power PF of the high frequency signal is the power Pl with a straight line. The dash line C1 illustrates the case where the temperature is the temperature To. The dash line C2 illustrates the case where the temperature changes by ΔT and becomes To+ΔT.

Power adjustment in the case where adjustment is conducted by the offset control signal OCT from the processor MPU to cause the variable offset VOFT to assume different values at the time of reference power monitor and at the time of transmission monitor will now be described with reference to FIG. 10.

In the description, a case where the variable offset VOFT is set by the output level adjustment circuit OFC to provide the sensor output with an offset of ΔVo at the time of transmission output monitor as compared with the time of reference power monitor is taken as an example. Therefore, the characteristic curves C1 and C2 (FIG. 9 and FIG. 10) illustrated by dash lines move in parallel by the offset ΔVo, and become characteristic curves D1 and D2 (FIG. 10) represented by solid lines.

Unless the offset of ΔVo is set, the sensor output becomes Vh (REFH) when the power PF of the high frequency power is the reference power Ph as described with reference to FIG. 9. Since the offset of ΔVo is added, the power PF of the high frequency signal for causing the sensor output to arrive at the point of the same value Vh (REFH) shifts (1) to a direction of small power, and becomes power Ph'.

The temperature characteristics of the sensor output at the time of transmission output monitor in the vicinity of a point where the sensor output arrives at the value of the sensor output corresponding to the reference power Ph is small as compared with temperature characteristics of the sensor output at the time of reference power monitor. In the case where the temperature becomes the temperature To+ΔT, a point where the sensor output arrives at a value Vh (REFH) T=To+ΔT of the sensor output corresponding to the reference power Ph at the time of transmission output monitor shifts by ΔP as compared with the power Ph' (2).

The power adjustment is executed based upon the reference power Ph. If the temperature changes to the temperature To+ΔT in the case where the target electric power is set to, for example, power Ph' when the temperature is the temperature To, the power is adjusted (2) to a value larger by ΔP as compared with the target electric power Ph'. In other words, it becomes possible to add temperature characteristics corresponding to the power change ΔP/temperature change ΔT to the result of the power adjustment.

In the case where the first reference power PW1 has power Pl, a point where the sensor output arrives at the value Vl (REFL) also shifts to a direction of small power and becomes power Pl' due to the offset in the same way. In a case where the target electric power at the time when the temperature is the temperature To is set to, for example, power Pl', adjustment to a value larger by ΔP is conducted (3) when the temperature changes to the temperature To+ΔT. In other words, it becomes possible to add temperature characteristics corresponding to the power change ΔP/temperature change ΔT to the result of the power adjustment. As for the value Vl (REFL), see FIG. 9.

Therefore, it becomes possible to calculate the internal division ratio using the sensor output Vl (REFL) corresponding to the first reference power PW1 (Pl) and the sensor output Vh (REFH) T=To corresponding to the second reference power PW2 (Ph) and add the temperature dependence when conducting power adjustment by using the internal division ratio. Added dependence becomes temperature characteristics corresponding to the power change ΔP/temperature change ΔT. It becomes possible to compensate the temperature dependence generated in portions, for example, of the power sensor PSN and subsequent stages by using the added temperature dependence.

Figure 11:
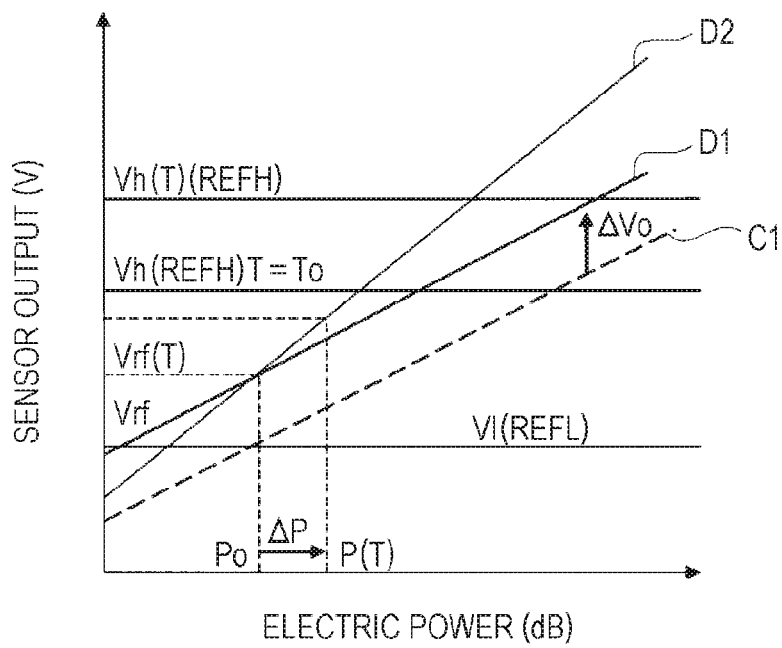
FIG. 11 is a characteristic diagram illustrating characteristics of a power sensor according to the second embodiment.

A temperature compensation value compensated by the temperature compensation according to the second embodiment will now be described quantitatively with reference to FIG. 11. FIG. 11 is a characteristic diagram illustrating characteristics of the power sensor PSN in the same way as FIG. 9 and FIG. 10. The abscissa axis indicates electric power and the ordinate axis indicates the sensor output.

First, characteristics of the power sensor PSN are defined. Characteristics of the power sensor PSN are represented by Expression (4). Here, Vp indicates the sensor output, A indicates a sensitivity coefficient of the power sensor PSN, α indicates temperature dependence of the sensitivity coefficient A, and ΔT indicates the temperature change. P indicates power of the high frequency signal, and Vo indicates the offset voltage.

[Math. 4]

$$Vp = A \times (1 + \alpha \Delta T) R \times P + Vo \qquad \text{Expression (4)}$$

The variable offset VOFT at the time of reference power monitor is set to a predetermined value, for example, without offset, and the variable offset VOFT at the time of transmission output monitor is set to a value of the voltage ΔV. By doing so, characteristics Vdc of the power sensor PSN at the time of the reference power monitor is represented by Expression (5). Characteristics Vrf of the power sensor PSN at the time of transmission output monitor is represented by Expression (6).

[Math. 5]

$$Vdc = A \times (1 + \alpha \Delta T) R \times P + Vo \qquad \text{Expression (5)}$$

[Math. 6]

$$Vrf = A \times (1 + \alpha \Delta T) R \times P + Vo + \Delta Vo \qquad \text{Expression (6)}$$

Then, the internal division ratio is calculated. It is now supposed that the value of the first reference power PW1 is Pl and the value of the second reference power PW2 is Ph. When the first reference power PW1 (Pl) is supplied in the case where the temperature is the temperature To, the sensor output voltage Vl of the power sensor PSN is represented by Expression (7). When the second reference power PW2 (Ph) is supplied in the case where the temperature is the temperature To, the sensor output voltage Vh of the power sensor PSN is represented by Expression (8).

[Math. 7]

$$Vl = A \times Pl + Vo \qquad \text{Expression (7)}$$

[Math. 8]

$$Vh = A \times Ph + Vo \qquad \text{Expression (8)}$$

If the value of the target electric power, which becomes the target of adjustment, is set to Po (FIG. 11) by the power adjustment, when the temperature is the temperature To, the value Vrf of the sensor output at the time of transmission output monitor is represented by Expression (9). In other words, the voltage value of the sensor output, which is output from the power sensor PSN, when the power PF of the high frequency signal having the value Po of the target electric power is supplied to the power sensor PSN is Vrf (FIG. 11).

[Math. 9]

$$Vrf = A \times Po + Vo + \Delta Vo \qquad \text{Expression (9)}$$

The internal division ratio R is represented by Expression (10) based on Expression (7) to Expression (9).

[Math. 10]

$$R = (Vrf - Vl)/(Vh - Vl) = [A \times (Po - Pl) + \Delta Vo]/[A \times (Ph - Pl)] \qquad \text{Expression (10)}$$

When the temperature is the temperature To+ΔT and the first reference power PW1 (Pl) is supplied to the power sensor PSN, the sensor output Vl (T) is represented by Expression (11). At this time, the sensor output Vh(T) at the time when the second reference power PW2 (Ph) is supplied to the power sensor PSN is represented by Expression (12).

[Math. 11]

$$Vl(T) = A \times (1 + \alpha \Delta T) \times Pl + Vo \qquad \text{Expression (11)}$$

[Math. 12]

$$Vh(T) = A \times (1 + \alpha \Delta T) \times Ph + Vo \qquad \text{Expression (12)}$$

When the temperature has become the temperature To+ΔT, an expected value Vrf(T) of the sensor output corresponding to the target electric power Po is represented by Expression (13). At the time of power adjustment, the processor MPU compares the value of the sensor output, which is output from the power sensor PSN at the time of transmission output monitor, with the expected value Vrf(T), and adjusts the gain of the variable gain amplifier PGA to obtain coincidence. As a result, the output electric power of the wireless communication device becomes the target electric power Po. The expected value Vrf(T) is found based on the internal division ratio R, the sensor output Vl(T) corresponding to the first reference power PW1 (Pl) at the time when the temperature is the temperature To+ΔT, and the sensor output Vh(T) corresponding to the second reference power PW2 (Ph) at the time when the temperature is the temperature To+ΔT. Here, the internal division ratio is represented by Expression (10), and the sensor outputs Vl(T) and Vh(T) are represented by Expression (11) and Expression (12).

[Math. 13]

$$\begin{aligned} Vrf(T) &= R \times (Vh(T) - Vl(T)) + Vl(T) \\ &= [A \times (Po - Pl) + \Delta Vo]/[A \times (Ph - Pl)] \times \\ &\quad [A \times (1 + \alpha \Delta T) \times (Ph - Pl)] + A \times (1 + \alpha \Delta T) \times \\ &\quad Pl + Vo \\ &= A \times (1 + \alpha \Delta T) \times (Po + \Delta Vo/A) + Vo \end{aligned} \qquad \text{Expression (13)}$$

If the input power supplied to the power sensor PSN at the time the power sensor PSN outputs the sensor output of the expected value Vrf(T) is P(T), Expression (6) becomes as indicated by Expression (14), and the input power P(T) is represented by Expression (15). A relation between the expected value Vrf(T) and the input power P(T) is illustrated in FIG. 11.

[Math. 14]

$$Vrf(T) = A \times (1 + \alpha \Delta T) R \times P(T) + Vo + \Delta Vo \qquad \text{Expression (14)}$$

[Math. 15]

$$P(T) = (Vrf(T) - Vo - \Delta Vo)/[A \times (1 + \alpha \Delta T)] \qquad \text{Expression (15)}$$

As illustrated in FIG. 11, a power precision error ΔP(T) of the power sensor PSN is ΔP(T)=P(T)−Po. If Expression (15) is substituted into this, the power precision error ΔP(T) is represented by Expression (16).

[Math. 16]

$$\Delta P(T) = (Vrf(T) - Vo - \Delta Vo)/[A \times (1 + \alpha \Delta T)] - Po \qquad \text{Expression (16)}$$

In addition, if Expression (13) is applied, the power precision error ΔP(T) is represented by Expression (17).

[Math. 17]

$$\begin{aligned} \Delta P(T) &= [A \times (1 + \alpha \Delta T) \times (Po + \Delta Vo/A) - \Delta Vo]/ \\ &\quad [A \times (1 + \alpha \Delta T)] - Po \\ &= \Delta Vo/A \times [\alpha T/(1 - \alpha \Delta T)] \\ &\approx \Delta Vo/A \times \alpha \times \Delta T \end{aligned} \qquad \text{Expression (17)}$$

From Expression (17), the power precision error ΔP(T) has temperature characteristics proportionate to the offset ΔVo set by the variable offset VOFT. In a case where temperature dependence occurs in the power sensor PSN or a subsequent portion, or in the power sensor PSN or a preceding portion, therefore, it is possible to compensate the temperature dependence as a whole by power adjustment, by setting the variable offset VOFT to a suitable value. For example, even in the case where temperature dependence occurs in the coupler CUP, it is possible to compensate the temperature dependence as the whole of the wireless communication device MOD by setting the variable offset to a suitable value.

Figure 12:
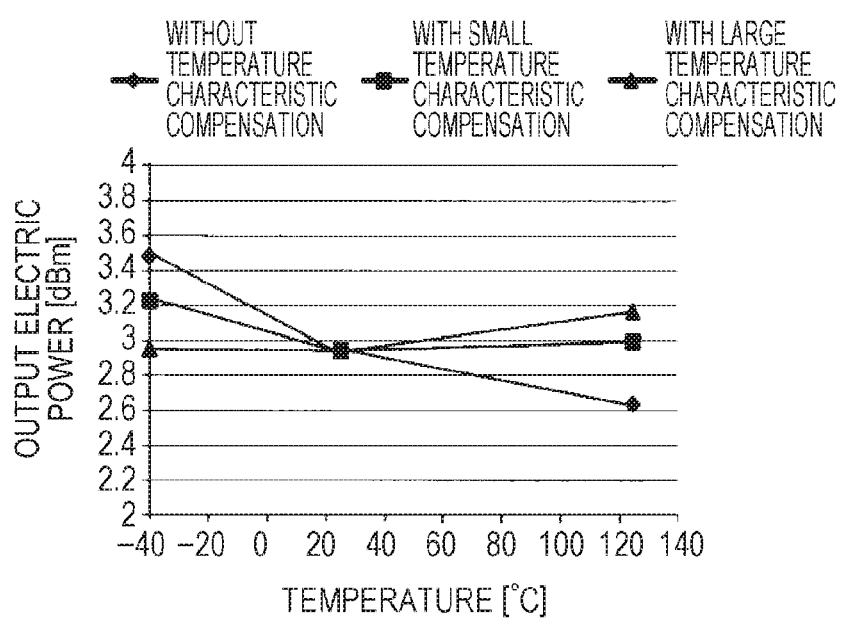
FIG. 12 is a characteristic diagram illustrating precision of a wireless communication device according to the second embodiment.

FIG. 12 is a characteristic diagram illustrating a result obtained by measuring output electric power from the wireless communication device MOD while changing the temperature. In FIG. 12, the abscissa axis indicates the temperature, and the ordinate axis indicates output electric power from the wireless communication device MOD. Here, the variable offset VOFT at the time of transmission output monitor is set to a predetermined offset value, and the value of the variable offset VOFT at the time of reference power monitor is changed.

In FIG. 12, a characteristic curve indicated by a rhomb (♦) illustrates a case where the value of the variable offset VOFT at the time of reference power monitor is set to the predetermined offset value that is the same as the value of the variable offset VOFT at the time of transmission output monitor. In this case, the temperature compensation is not conducted (without temperature characteristic compensation). In FIG. 12, a characteristic curve indicated by a square (■) illustrates a case where the value of the variable offset VOFT at the time of the reference power monitor is set to a first offset smaller than the above-described predetermined offset value. In this case, temperature compensation is conducted. However, the compensation quantity is small (temperature characteristic compensation is small). In FIG. 12, a characteristic curve indicated by a triangle (▲) illustrates a case where the value of the variable offset VOFT at the time of reference power monitor is set to a second offset, which is further smaller than the above-described first offset. In this case, the compensation quantity becomes large (temperature characteristic compensation is large).

FIG. 12 illustrates an example in which the variable offset VOFT at the time of transmission output monitor is fixed and the variable offset at the time of reference power monitor is changed. In other words, however, the characteristic curve indicated by squares can be regarded as illustrating characteristics in a case where the variable offset VOFT at the time of transmission out monitor becomes larger by the first offset. In the same way, the characteristic curve indicated by triangles can be regarded as illustrating characteristics in a case where the variable offset VOFT at the time of transmission output monitor becomes larger by the second offset.

In order to find the characteristic curves illustrated in FIG. 12, the output electric power is adjusted to become 2.85 dBm when the temperature is 25° C. in the inspection process illustrated in FIG. 1. On the other hand, at the time of distance measurement, output electric power at the time when the temperature is −40° C. and 125° C. is measured. The characteristic curves illustrated in FIG. 12 are obtained by conducting linear interpolation between output electric power points measured at these temperatures.

In the case where there is no temperature characteristic compensation, the output electric power precision is approximately 0.9 dB. When the temperature characteristic compensation is small and the temperature characteristic compensation is large, the output electric power precision becomes approximately 0.3 dB and the temperature characteristics are improved. Furthermore, as illustrated in FIG. 12, in the case where the temperature characteristic compensation is large, inclination of the characteristic curve rises rightward compared to the case where the temperature characteristic compensation is small and it is appreciated that effects of the temperature adjustment circuit appear.

In FIG. 7 and FIG. 8, an example in which the switches SW11, SW12, SW21, and SW22 are controlled by the reference power selection signals Phe and Pbe is illustrated. However, this is not restrictive. For example, it is possible to form the resistance element R4 illustrated in FIG. 7 and FIG. 8 by using a variable resistance element and change the resistance value of the variable resistance element by using the reference power selection signal. In this case, for example, the source of the P-type FET PT3 is connected to the electric power supply voltage Vd, and the source of the N-type FET NT2 is connected to the ground voltage Vs. The drain current flowing through the P-type FET PT3 and the N-type FET NT2 changes by changing the resistance value of the variable resistance element. Therefore, the values of the voltage signals RH and RL can be changed, and it becomes possible to generate reference power having values that are different from each other. In this case, it becomes possible to omit the switches SW11, SW12, SW21, and SW22, the N-type FET NT3, and the P-type FET PT4, and it becomes possible to reduce the number of elements.

Even in the case where the symmetry of the voltage of the high frequency signal at the nodes dno and /dno collapses, the power can be measured more accurately by conducting addition on the positive electrode side and the negative side electrode to the reference voltage Vref.

Heretofore, the invention made by the present inventors has been described specifically based on embodiments. The present invention is not restricted to the above-described embodiments. As a matter of course, the present invention can be changed in various ways without departing from the spirit.

What is claimed is:

1. A power controllable wireless communication device comprising:
   a variable gain amplifier having a gain that can be controlled based on a gain control signal;
   a reference power generation circuit configured to generate first reference power and second reference power differing from the first reference power;
   a sensor circuit supplied with selectively power of a high frequency signal output from the variable gain amplifier, and the first reference power and the second reference power generated by the reference power generation circuit; and
   a control circuit configured to generate the gain control signal based on a sensor output from the sensor circuit,
   wherein when controlling power, the control circuit generates the gain control signal based on ratios among a first sensor output corresponding to the first reference power, and a second sensor output corresponding to the second reference power, which are output from the sensor circuit, and a high frequency sensor output corresponding to the power of the high frequency signal.

2. The power controllable wireless communication device according to claim 1, wherein
   the ratio is an internal division ratio between a difference between the first sensor output and the second sensor output and a difference between the first sensor output and the high frequency sensor output.

3. The power controllable wireless communication device according to claim 2, wherein
the control circuit comprises a storage circuit configured to store the internal division ratio, and
when controlling power, the gain control signal is generated by the control circuit to provide the power controllable wireless communication device with predetermined power based on a difference between the sensor output corresponding to the first reference power and the sensor output corresponding to the second reference power, which are output from the sensor circuit, and the internal division ratio stored in the storage circuit.

4. The power controllable wireless communication device according to claim 3, wherein
the reference power generation circuit comprises a band gap voltage generation circuit, and generates a first voltage and a second voltage having a positive polarity with respect to a predetermined reference voltage and a first voltage and a second voltage having a negative polarity with respect to the predetermined reference voltage based on a consultation voltage generated by the band gap voltage generation circuit, and
the first reference power is formed of the first voltage of the positive polarity and the first voltage of the negative polarity, and the second reference power is formed of the second voltage of the positive polarity and the second voltage of the negative polarity.

5. The power controllable wireless communication device according to claim 4, wherein
the sensor circuit comprises a variable offset amplifier having a changeable offset,
the variable offset amplifier is controlled by the control circuit to have an offset when outputting the sensor output corresponding to the first reference power and the sensor output corresponding to the second reference power and have a different offset when outputting the high frequency sensor output corresponding to the power of the high frequency signal.

6. A power controllable wireless communication device including a microprocessor and a semiconductor device power controlled by the microprocessor, wherein
the semiconductor device comprises:
a variable gain amplifier configured to amplify a transmission signal and be changeable in gain by a gain control signal;
a power amplifier configured to amplify a high frequency signal from the variable gain amplifier and transfer the amplified high frequency signal to an antenna;
a power sensor configured to detect power of the high frequency signal transferred from the power amplifier to the antenna; and
an interface circuit coupled to the power sensor, the variable gain amplifier, and the microprocessor,
the power sensor comprises:
a reference power generation circuit configured to generate first reference power and second reference power different from the first reference power; and
a selection circuit configured to select the first reference power, the second reference power, and the power of the high frequency signal from the power amplifier depending upon control from the microprocessor via the interface circuit,
the microprocessor receives a first sensor output, which is output from the power sensor when the first reference power is selected by the selection circuit, a second sensor output, which is output from the power sensor when the second reference power is selected by the selection circuit, and a third sensor output, which is output from the power sensor when the power of the high frequency signal is selected by the selection circuit, via the interface circuit, and
the microprocessor forms a gain control signal and supplies the gain control signal to the variable gain amplifier via the interface circuit, when controlling power of the power controllable wireless communication device based on ratios among the first sensor output, the second sensor output, and the third sensor output.

7. The power controllable wireless communication device according to claim 6, wherein
the ratio is an internal division ratio between a difference between the first sensor output and the second sensor output, and a difference between the first sensor output and the third sensor output,
the microprocessor comprises a storage circuit configured to store the internal division ratio, and
when controlling the power of the power controllable wireless communication device, the microprocessor forms a gain control signal based on a difference between a sensor output corresponding to the first reference power output from the power sensor and a sensor output corresponding to the second reference power output from the power sensor, and the internal division ratio stored in the storage circuit.

8. The power controllable wireless communication device according to claim 7, wherein
the reference power generation circuit comprises:
a band gap voltage generation circuit configured to generate a consultation voltage; and
a selection generation circuit configured to generate a first voltage or a second voltage having a positive polarity with respect to a reference voltage, and a first voltage or a second voltage having a negative polarity with respect to the reference voltage, based on the consultation voltage generated by the band gap voltage generation circuit, depending upon a reference power selection signal supplied from the microprocessor via the interface circuit, and
the first reference power is formed of the first voltage of positive polarity and the first voltage of negative polarity, and the second reference power is formed of the second voltage of positive polarity and the second voltage of negative polarity.

9. The power controllable wireless communication device according to 8, wherein
the selection circuit comprises:
a first current conversion circuit configured to receive the high frequency signal output from the power amplifier and generate a current signal corresponding to amplitude of the high frequency signal with respect to the reference voltage;
a second current conversion circuit configured to be supplied with the first voltage or the second voltage of positive polarity and the first voltage or the second voltage of negative polarity from the selection generation circuit; and
a selector configured to select a current signal from the first current conversion circuit or a current signal from the second current conversion circuit under control from the microprocessor and output a voltage signal corresponding to the selected current signal.

10. The power controllable wireless communication device according to claim 8, wherein the power sensor comprises a variable offset amplifier configured to amplify the output from the selection circuit, and the variable offset amplifier is controlled by the microprocessor to have an offset when outputting the sensor output corresponding to the first reference power and the sensor output corresponding to the second reference power, and have a different offset when outputting the sensor output corresponding to the power of the high frequency signal.

* * * * *